(12) United States Patent
Van Den Hoek et al.

(10) Patent No.: US 11,784,176 B2
(45) Date of Patent: Oct. 10, 2023

(54) LIGHT EMITTING DIODE DEVICE CONTAINING A POSITIVE PHOTORESIST INSULATING SPACER AND A CONDUCTIVE SIDEWALL CONTACT AND METHOD OF MAKING THE SAME

(71) Applicant: NANOSYS, INC., Milpitas, CA (US)

(72) Inventors: Willibrordus Gerardus Maria Van Den Hoek, Saratoga, CA (US); Tsun Yin Lau, Sunnyvale, CA (US); Cameron Danesh, Los Altos Hills, CA (US); Fariba Danesh, Los Altos Hills, CA (US)

(73) Assignee: NANOSYS, INC., Milpitas, CA (US)

( * ) Notice: Subject to any disclaimer, the term of this patent is extended or adjusted under 35 U.S.C. 154(b) by 0 days.

(21) Appl. No.: 17/818,822

(22) Filed: Aug. 10, 2022

(65) Prior Publication Data

US 2022/0384404 A1   Dec. 1, 2022

Related U.S. Application Data

(62) Division of application No. 16/884,523, filed on May 27, 2020, now Pat. No. 11,444,065.

(Continued)

(51) Int. Cl.
*H01L 25/16* (2023.01)
*H01L 33/40* (2010.01)
(Continued)

(52) U.S. Cl.
CPC ........ *H01L 25/167* (2013.01); *H01L 33/0025* (2013.01); *H01L 33/06* (2013.01);
(Continued)

(58) Field of Classification Search
CPC ... H01L 25/167; H01L 33/0025; H01L 33/06; H01L 33/08; H01L 33/12; H01L 33/24;
(Continued)

(56) References Cited

U.S. PATENT DOCUMENTS 8,669,574 B2   3/2014   Konsek et al.
9,281,442 B2   3/2016   Romano et al.
(Continued)

FOREIGN PATENT DOCUMENTS

EP   2328027        6/2011
JP   2003-234179    8/2003
(Continued)

OTHER PUBLICATIONS

International Search Report and Written Opinion of the International Search Authority for International Patent Application No. PCT/US2020/034660, dated Sep. 16, 2020, 12 pages.
(Continued)

*Primary Examiner* — Mark W Tornow
(74) *Attorney, Agent, or Firm* — THE MARBURY LAW GROUP PLLC

(57) ABSTRACT

A light emitting device includes a backplane, an array of light emitting diodes attached to a frontside of the backplane, a positive tone, imageable dielectric material layer, such as a positive photoresist layer, located on the frontside of the backplane and laterally surrounding the array of light emitting diodes, such that sidewalls of the light emitting diodes contacting the positive tone, imageable dielectric (Continued)

material layer have a respective reentrant vertical cross-sectional profile, and at least one common conductive layer located over the positive tone, imageable dielectric material layer and contacting the light emitting diodes.

6 Claims, 27 Drawing Sheets

Related U.S. Application Data

(60) Provisional application No. 62/865,622, filed on Jun. 24, 2019, provisional application No. 62/854,428, filed on May 30, 2019.

(51) Int. Cl.
*H01L 33/62* (2010.01)
*H01L 33/56* (2010.01)
*H01L 33/12* (2010.01)
*H01L 33/06* (2010.01)
*H01L 33/32* (2010.01)
*H01L 33/24* (2010.01)
*H01L 33/08* (2010.01)
*H01L 33/00* (2010.01)

(52) U.S. Cl.
CPC .............. *H01L 33/08* (2013.01); *H01L 33/12* (2013.01); *H01L 33/24* (2013.01); *H01L 33/32* (2013.01); *H01L 33/405* (2013.01); *H01L 33/56* (2013.01); *H01L 33/62* (2013.01); *H01L 2933/005* (2013.01); *H01L 2933/0066* (2013.01)

(58) Field of Classification Search
CPC ....... H01L 33/32; H01L 33/405; H01L 33/56; H01L 33/62
See application file for complete search history.

(56) References Cited

U.S. PATENT DOCUMENTS

| | | | |
|---|---|---|---|
| 9,419,183 | B2 | 8/2016 | Lowgren et al. |
| 9,444,007 | B2 | 9/2016 | Kryliouk et al. |
| 10,627,673 | B2 | 4/2020 | Kim et al. |
| 2007/0210315 | A1 | 9/2007 | Masselink et al. |
| 2017/0068038 | A1 | 3/2017 | Danesh et al. |
| 2017/0227816 | A1 | 8/2017 | Jansen et al. |
| 2017/0346011 | A1 | 11/2017 | Danesh et al. |
| 2017/0373046 | A1 | 12/2017 | Gardner et al. |
| 2018/0109262 | A1 | 4/2018 | Lee et al. |
| 2018/0114878 | A1 | 4/2018 | Danesh et al. |
| 2018/0182746 | A1* | 6/2018 | Bibi ................. H01L 33/20 |
| 2018/0198047 | A1 | 7/2018 | Danesh et al. |
| 2018/0366450 | A1 | 12/2018 | Gardner et al. |
| 2019/0088820 | A1 | 3/2019 | Danesh et al. |
| 2019/0310514 | A1* | 10/2019 | Kim ................. H01L 33/405 |
| 2019/0326478 | A1 | 10/2019 | Danesh et al. |
| 2020/0381411 | A1 | 12/2020 | Van Den Hoek et al. |
| 2020/0388733 | A1* | 12/2020 | Chen ................. H01L 33/58 |

FOREIGN PATENT DOCUMENTS

| | | |
|---|---|---|
| JP | 2007-531321 | 11/2007 |
| KR | 10-2007-0106364 | 11/2007 |
| KR | 10-1486568 | 1/2015 |

OTHER PUBLICATIONS

Notification Concerning Transmittal of International Preliminary Report on Patentability and Written Opinion of the International Search Authority for International Patent Application No. PCT/US2020/034660, dated Dec. 9, 2021, 8 pages.

* cited by examiner

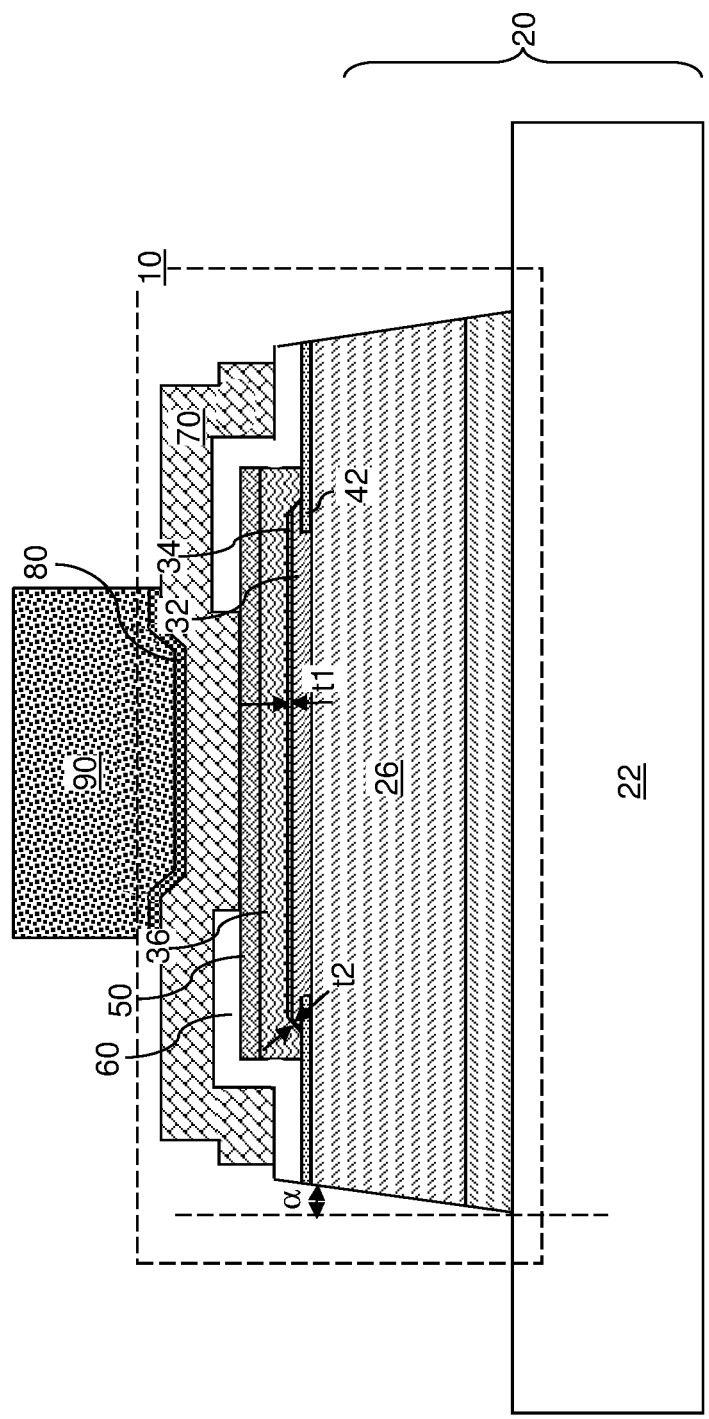

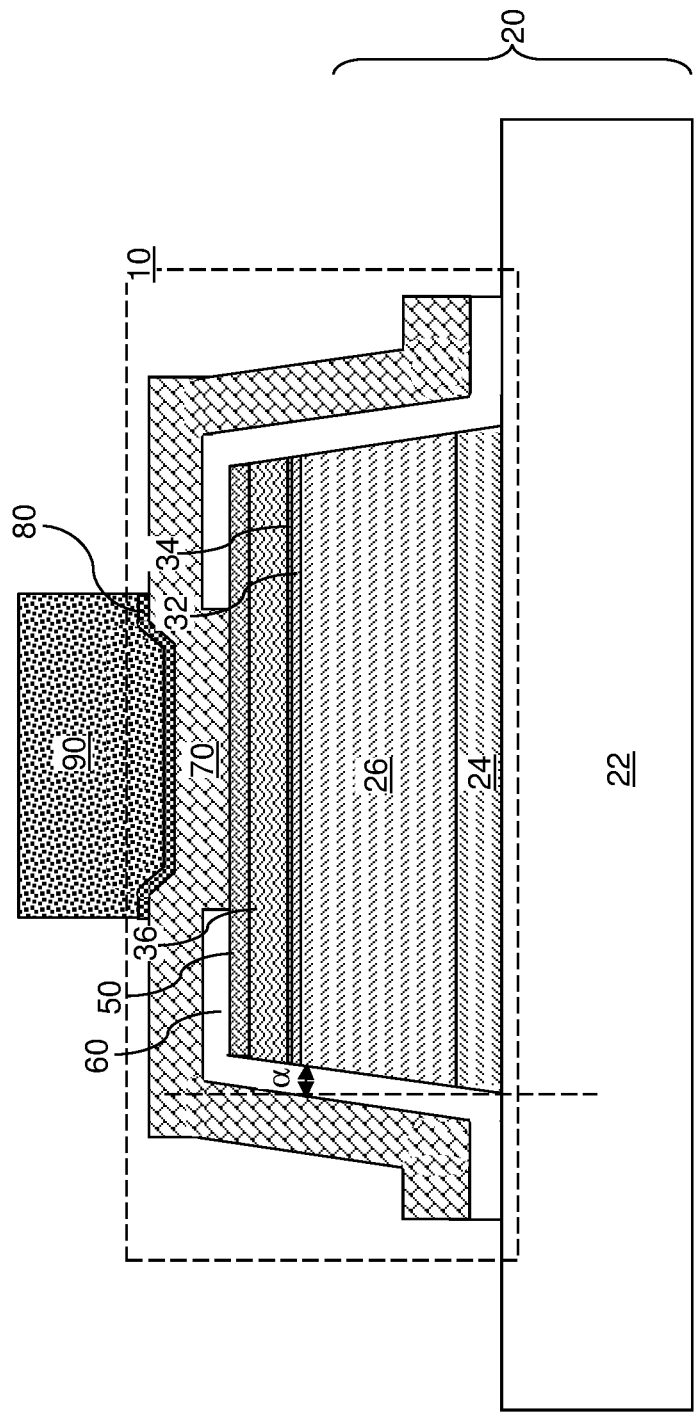

LIGHT EMITTING DIODE DEVICE CONTAINING A POSITIVE PHOTORESIST INSULATING SPACER AND A CONDUCTIVE SIDEWALL CONTACT AND METHOD OF MAKING THE SAME

FIELD

The present invention relates to light emitting devices, and particularly to a light emitting diode device containing a positive photoresist insulating spacer and a conductive sidewall contact to the light emitting diodes and methods of fabricating the same.

BACKGROUND

Light emitting devices such as light emitting diodes (LEDs) are used in electronic displays, such as backlights in liquid crystal displays located in laptops or televisions, and LED billboards and microdisplays. Light emitting devices include light emitting diodes (LEDs) and various other types of electronic devices configured to emit light.

SUMMARY

According to an aspect of the present disclosure, a light emitting device is provided, which comprises: a backplane; an array of light emitting diodes attached to a frontside of the backplane; a positive tone, imageable dielectric material layer located on the frontside of the backplane and laterally surrounding the array of light emitting diodes, wherein sidewalls of the light emitting diodes contacting the positive tone, imageable dielectric material layer have a respective reentrant vertical cross-sectional profile; and at least one common conductive layer located over the positive tone, imageable dielectric material layer and contacting the light emitting diodes.

According to another aspect of the present disclosure, a method of forming a light emitting device is provided, which comprises: attaching an array of light emitting diodes to a frontside of a backplane; applying a positive tone, imageable dielectric material layer to a frontside of the backplane; vertically recessing the positive tone, imageable dielectric material layer such that a top surface of the positive tone, imageable dielectric material layer is formed below a horizontal plane including top surfaces of the light emitting diodes, wherein sidewalls of the light emitting diodes contacting the positive tone, imageable dielectric material layer have a respective reentrant vertical cross-sectional profile; forming a conductive adhesion layer at least on upper portions of sidewalls of the light emitting diodes and the top surface of the positive tone, imageable dielectric material layer; and forming a transparent conductive layer on a frontside surface of the conductive adhesion layer.

BRIEF DESCRIPTION OF THE DRAWINGS

FIG. 2B is a vertical cross-sectional view of a second configuration of a light emitting diode according to an embodiment of the present disclosure.

FIG. 5B is a vertical cross-sectional view of an eighth configuration of a light emitting diode according to an embodiment of the present disclosure.

DETAILED DESCRIPTION

Figure 1:
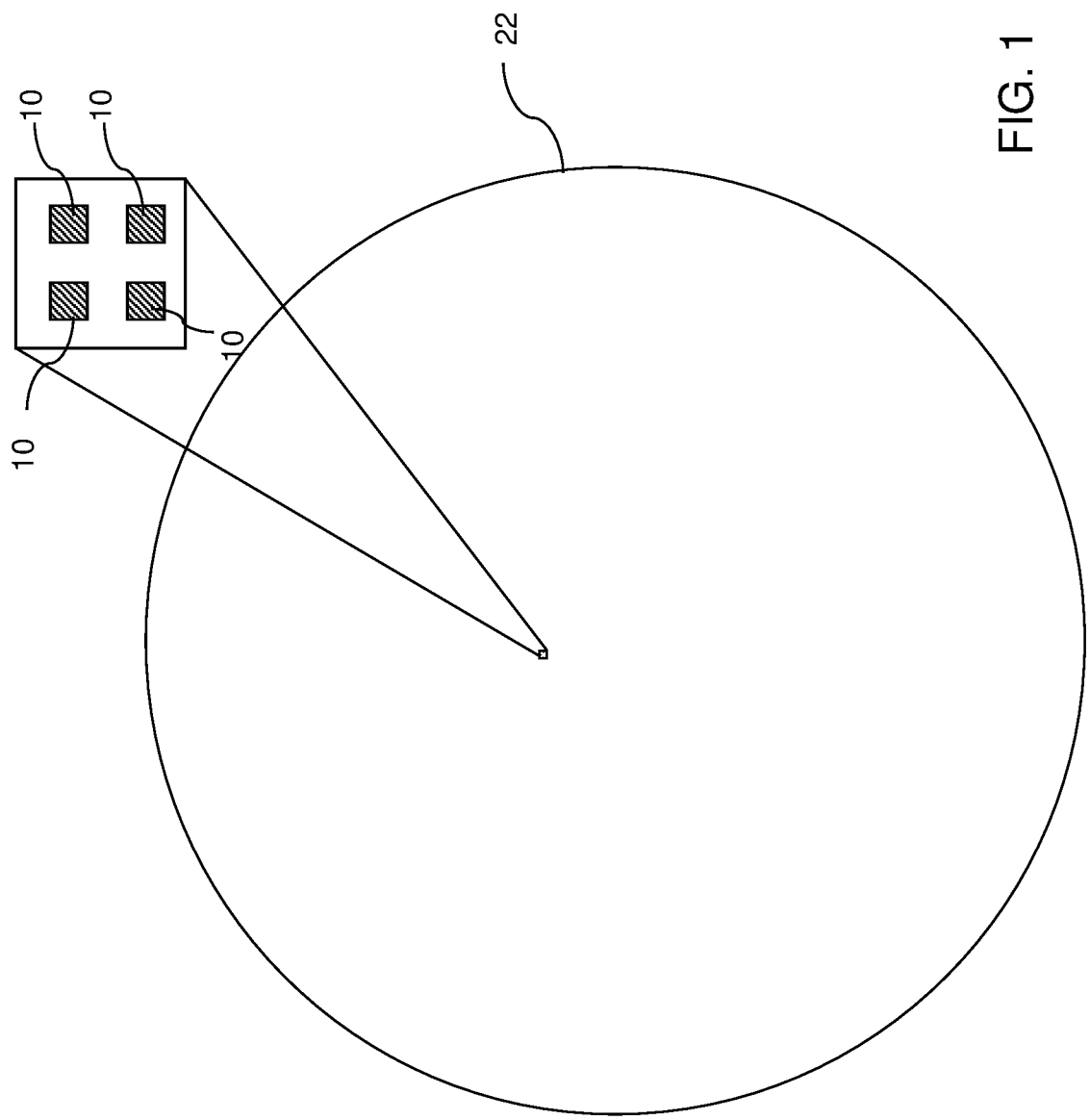
FIG. 1 is a top-down view of a source substrate with light emitting diodes thereupon.

As discussed above, the embodiments of the present disclosure are directed to a light emitting device containing a positive tone, imageable dielectric material, such as a positive photoresist insulating spacer between the light emitting diodes and a conductive sidewall contact to the light emitting diodes and methods of fabricating the same, the various aspects of which are discussed herein in detail. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "layer" refers to a continuous portion of at least one material including a region having a thickness. A layer may consist of a single material portion having a homogeneous composition, or may include multiple material portions having different compositions.

As used herein, a "conductive material" refers to a material having electrical conductivity greater than $1.0 \times 10^2$ S/cm. As used herein, an "insulator material" or a "dielectric material" refers to a material having electrical conductivity less than $1.0 \times 10^{-5}$ S/cm. As used herein, a "semiconducting material" refers to a material having electrical conductivity in the range from $1.0 \times 10^{-5}$ S/cm to $1.0 \times 10^3$ S/cm. As used herein, a "metallic material" refers to a conductive material including at least one metallic element therein. All measurements for electrical conductivities are made at the standard condition.

A light emitting device, such as a display device, such as for example, a direct view display can be formed from an ordered array of pixels. Each pixel can include a set of subpixels that emit light at a respective peak wavelength. For example, a pixel can include a red subpixel, a green subpixel, and a blue subpixel. Each subpixel can include one or more light emitting diodes that emit light of a particular wavelength. Each pixel is driven by a backplane circuit such that any combination of colors within a color gamut may be shown on the display for each pixel. The display panel can be formed by a process in which light emitting diode (LED) subpixels are soldered to, or otherwise electrically attached to, a bond pad located on a backplane. The bond pad is electrically driven by the backplane circuit and other driving electronics.

In the embodiments of the present disclosure, a method for fabrication of a multicolor (e.g., three or more color) direct view display may be performed by using light emitting devices which emit different color light in each pixel. In one embodiment, nanostructure (e.g., nanowire) or bulk (e.g., planar) LEDs may be used. Each LED may have a respective blue, green and red light emitting active region to form blue, green and red subpixels in each pixel. In another embodiment, a down converting element (e.g., red emitting phosphor, dye or quantum dots) can be formed over a blue or green light emitting LED to form a red emitting subpixel. In another embodiment, a blue or green light emitting nanowire LED in each subpixel is paired with a red emitting planar LED, such as an organic or inorganic red emitting planar LED to form a red emitting subpixel.

Referring to FIG. 1, a source substrate including an array of light emitting diodes 10 is illustrated. The source substrate can include a support substrate 22 on which various processing steps are performed to form the light emitting device containing an array of light emitting diodes 10. Light emitting diodes 10 on the support substrate 22 can be subsequently transferred to a backplane to form a light emitting device.

The light emitting device can include at least one pixel, which may be a plurality of pixels arranged as an array. Each pixel can include a plurality of subpixels. Each subpixel includes at least one light emitting diode. Each pixel includes multiple subpixels configured to emit light at different peak emission wavelengths. For example, a pixel may include a red subpixel, a green subpixel, and a blue subpixel. The red subpixel can include at least one red-light-emitting diode, the green subpixel can include at least one green-light-emitting diode, and the blue subpixel can include at least one blue-light-emitting diode.

The light emitting diodes 10 on the support substrate 22 may include multiple types of light emitting diodes that are necessary to form a pixel. In this case, multiple types of light emitting diodes 10 can be transferred to the backplane to provide a light emitting device. Alternatively, the light emitting devices 10 on the support substrate 22 may include less than all types of light emitting diodes that are necessary to form a pixel. In this case, multiple source substrates including different types of light emitting diodes can be employed to provide multiple type of light emitting diodes 10 to be transferred and attached to the backplane. In an illustrative example, if a source substrate includes only a single type of light emitting diodes, a first source substrate including red-light-emitting diodes, a second substrate including green-light-emitting diodes, and a third substrate including blue-light-emitting diodes can be employed to provide three different types of light emitting diodes. Each light emitting diode transferred from a source substrate to the backplane is attached to the backplane, for example, by bonding, and functions as a subpixel or a component of a subpixel (in case a subpixel includes two or more light emitting diodes) of a pixel of a light emitting device including a backplane and at least one pixel, such as a two-dimensional array of pixels.

Each light emitting diode 10 can have any configuration known in the art. In one embodiment, the light emitting diode 10 may be a bottom-emitting diode, i.e., a light emitting diode in a bottom-emitting configuration. As used herein, a bottom-emitting diode refers to a light emitting diode that emits more than 50% of its light output along a direction that passes through a semiconductor material layer on which an active region is initially formed. In contrast, in another embodiment, the light emitting diode 10 may be a top-emitting diode which emits more than 50% of its light output along a direction that does not pass through a semiconductor material layer on which the active region is initially formed. The light emitting diode may be a vertical LED containing p-side and n-side contacts on opposite sides of the LED or a lateral LED containing both the p-side and n-side contains over the same side of the LED.

FIGS. 2A, 2B, 3A, 3B, 4A, 4B, 5A, and 5B illustrate various configurations of light emitting diodes 10 of the embodiments of the present disclosure. The various configurations of the light emitting diode of the embodiments of the present disclosure may be generally formed by providing a support substrate 22 and a single crystalline buffer semiconductor layer 24. The support substrate 22 is also referred to as a growth substrate, and can include a single crystalline growth substrate material such as $Al_2O_3$ (sapphire) using either basal plane or r-plane growing surfaces, diamond, Si, Ge, GaN, AlN, SiC in both wurtzite (α) and zincblende (β) forms, InN, GaP, GaAsP, GaAs, InP, ZnO, ZnS, and ZnSe. For example, the support substrate 22 can include sapphire (i.e., single crystalline aluminum oxide) with a suitable surface orientation. The support substrate 22 may comprise a patterned sapphire substrate (PSS) having a flat growth surface or a patterned (e.g., rough) growth surface. Bumps, dimples, and/or angled cuts may, or may not, be provided on the top surface of the support substrate 22 to facilitate epitaxial growth of the single crystalline compound semiconductor material of the single crystalline buffer semiconductor layer 24, to facilitate separation of the single crystalline buffer semiconductor layer 24 from the support substrate 22 in a subsequent separation process.

The single crystalline buffer semiconductor layer 24 includes a single crystalline compound semiconductor material such as a III-V compound semiconductor material, for example a Group III-nitride compound semiconductor material. The deposition process for forming the single crystalline buffer semiconductor layer 24 can employ any of metalorganic vapor phase epitaxy (MOVPE), molecular beam epitaxy (MBE), hydride vapor phase epitaxy (HYPE), liquid phase epitaxy (LPE), metal-organic molecular beam epitaxy (MOMBE), and atomic layer deposition (ALD). The single crystalline buffer semiconductor layer 24 can have a constant or a graded composition such that the composition of the single crystalline buffer semiconductor layer 24 at the interface with the support substrate 22 provides a substantial lattice matching with the two-dimensional lattice structure of the top surface of the support substrate 22. The composition of the single crystalline buffer semiconductor layer 24 can be gradually changed during the deposition process. If the support substrate 22 includes patterned sapphire, then the bottom surface of the single crystalline buffer semiconductor layer 24 may be a patterned (i.e., rough) surface.

The buffer semiconductor layer 24 may have a compositionally graded single crystalline semiconductor material that is epitaxially aligned to the single crystalline growth substrate material of the support substrate 22. The composition of the buffer semiconductor layer 24 can gradually change with thickness so that the lattice constant of the topmost portion of the buffer semiconductor layer 24 matches the lattice constant of a compound semiconductor material (such as an n-doped GaN material) to be grown on top of the buffer semiconductor layer 24 to provide an n-doped compound semiconductor substrate layer 26.

In one embodiment, the materials that can be employed for a bottom portion of the single crystalline buffer semiconductor layer 24 can be, for example, $Ga_{1-w-x}In_wAl_xN$ in which w and x range between zero and less than one, and can be zero (i.e., GaN) and are selected to match the lattice constant of the top surface of the support substrate 22. Optionally, As and/or P may also be included in the material for the bottom portion of the single crystalline buffer semiconductor layer 24, in which case the bottom portion of the single crystalline buffer semiconductor layer 24 can include $Ga_{1-w-x}In_wAl_xNi_{1-x-z}As_yP_z$ in which y and z between zero and less than one, that matches the lattice constant of the top surface of the support substrate 22. The materials that can be employed for an top portion of the single crystalline buffer semiconductor layer 24 include, but are not limited to, III-V compound materials, including III-nitride materials, such as gallium nitride (GaN), aluminum nitride (AlN), indium nitride (InN), gallium aluminum nitride, and gallium indium nitride, as well as other III-V materials, such as gallium phosphide (GaP), gallium arsenide (GaAs), gallium antimonide (GaSb), Indium phosphide (InP), indium arsenide (InAs), and indium antimonide (InSb). The composition of the single crystalline buffer semiconductor layer 24 can gradually change between the bottom portion of the single crystalline buffer semiconductor layer 24 and the top portion of single crystalline buffer semiconductor layer 24 such that dislocations caused by a gradual lattice parameter change along the growth direction (vertical direction) does not propagate to the top surface of the single crystalline buffer semiconductor layer 24. In one embodiment, a thin bottom portion of the single crystalline buffer semiconductor layer 24 may be undoped or unintentionally doped at a low concentration of silicon.

A high quality single crystalline surface with low defect density can be provided at the top surface of the single crystalline buffer semiconductor layer 24. Optionally, the top surface of the single crystalline buffer semiconductor layer 24 may be planarized to provide a planar top surface, for example, by chemical mechanical planarization. A suitable surface clean process can be performed after the planarization process to remove contaminants from the top surface of the single crystalline buffer semiconductor layer 24. The buffer semiconductor layer 24 may have a thickness of less than 1 micron, such as 0.3 microns to 0.5 microns.

An n-doped compound semiconductor substrate layer 26 is subsequently formed directly on the top surface of the single crystalline buffer semiconductor layer 24. The n-doped compound semiconductor substrate layer 26 can be formed as a continuous material layer having a uniform thickness over the entire top surface of the single crystalline buffer semiconductor layer 24. The n-doped compound semiconductor substrate layer 26 includes an n-doped compound semiconductor material. The n-doped compound semiconductor substrate layer 26 can be lattice matched with the single crystalline compound semiconductor material of the top portion of the single crystalline buffer semiconductor layer 24. The n-doped compound semiconductor substrate layer 26 may, or may not, include the same compound semiconductor material as the top portion of the single crystalline buffer semiconductor layer 24. In one embodiment, the n-doped compound semiconductor substrate layer 26 can include an n-doped direct band gap compound semiconductor material. In one embodiment, the n-doped compound semiconductor substrate layer 26 can include n-doped gallium nitride (GaN), indium gallium nitride (InGaN) or other III-V semiconductor materials, such as gallium phosphide or its ternary or quarternary compounds. The deposition process for forming the n-doped compound semiconductor substrate layer 26 can employ any of metalorganic vapor phase epitaxy (MOVPE), molecular beam epitaxy (MBE), hydride vapor phase epitaxy (HVPE), liquid phase epitaxy (LPE), metal-organic molecular beam epitaxy (MOMBE), and atomic layer deposition (ALD). The thickness of the n-doped compound semiconductor substrate layer 26 can be in a range from 3 microns to 10 microns, such as 4 microns to 7 microns, although lesser and greater thicknesses can also be employed. The support substrate 22, the single crystalline buffer semiconductor layer 24, and the n-doped compound semiconductor substrate layer 26 collectively comprise a substrate 20.

In some embodiments (such as the embodiments illustrated in FIGS. 1A, 1B, 2A, 2B, 3A, and 3B), a patterned growth mask layer 42 can be formed on the top surface of the substrate 20 (e.g., on top of the n-doped compound semiconductor substrate layer 26). The patterned growth mask layer 42 can be formed, for example, by depositing a dielectric material layer and patterning the dielectric material layer to form openings therein. For example, a silicon nitride layer, a silicon oxide layer, or a dielectric metal oxide layer (such as an aluminum oxide layer) can be formed on the top surface of the substrate 20. In one embodiment, the dielectric material layer can include a silicon nitride layer. The thickness of the dielectric material layer can be in a range from 3 nm to 100 nm, although lesser and greater thicknesses can also be employed.

A photoresist layer (not shown) can be applied over the top surface of the dielectric material layer, and can be lithographically patterned to form openings therethrough by lithographic exposure and development. In one embodiment, the openings in the photoresist layer can be formed as a two-dimensional periodic array. The size and shape of each opening can be selected to optimize the shape and size of semiconductor structures to be subsequently formed by a selective deposition process (such as a selective epitaxy process). The pattern of the openings in the photoresist layer can be transferred through the dielectric material layer to form the patterned growth mask layer 42. The photoresist layer can be subsequently removed, for example, by ashing. Alternatively, the growth mask layer can be patterned using electron beam lithography or nano-imprint lithography followed by etching. The patterned growth mask layer 42 includes openings, which may, or may not, be arranged as a two-dimensional periodic array. The shape of each opening may be circular, elliptical, or polygonal (such as hexagonal). A portion of the top surface of the n-doped compound semiconductor substrate layer 26 is physically exposed underneath each opening through the patterned growth mask layer 42.

The single crystalline buffer semiconductor layer 24, the n-doped compound semiconductor substrate layer 26, and additional structures to be formed thereupon will be subsequently patterned to define an array of subpixels, which is an array of light emitting diodes 10. Thus, each subsequently patterned area of the single crystalline buffer semiconductor layer 24 and the n-doped compound semiconductor substrate layer 26 will correspond to the area of a respective light emitting diode 10. For example, the array of light emitting diodes 10 may be formed as a rectangular array or a hexagonal array, and each light emitting diode 10 may be formed with a maximum lateral dimension (such as the diagonal of a rectangular shape or the diameter of a circumscribing circle of a hexagonal shape) in a range from 1 micron to 60 microns, such as from 2 microns to 30 microns. For example, the maximum lateral dimension of each opening through the patterned growth mask layer 42 may be in a range from 50 nm to 50 microns (such as from 200 nm to 10 microns), although lesser and greater dimensions may also be employed.

Figure 2A:
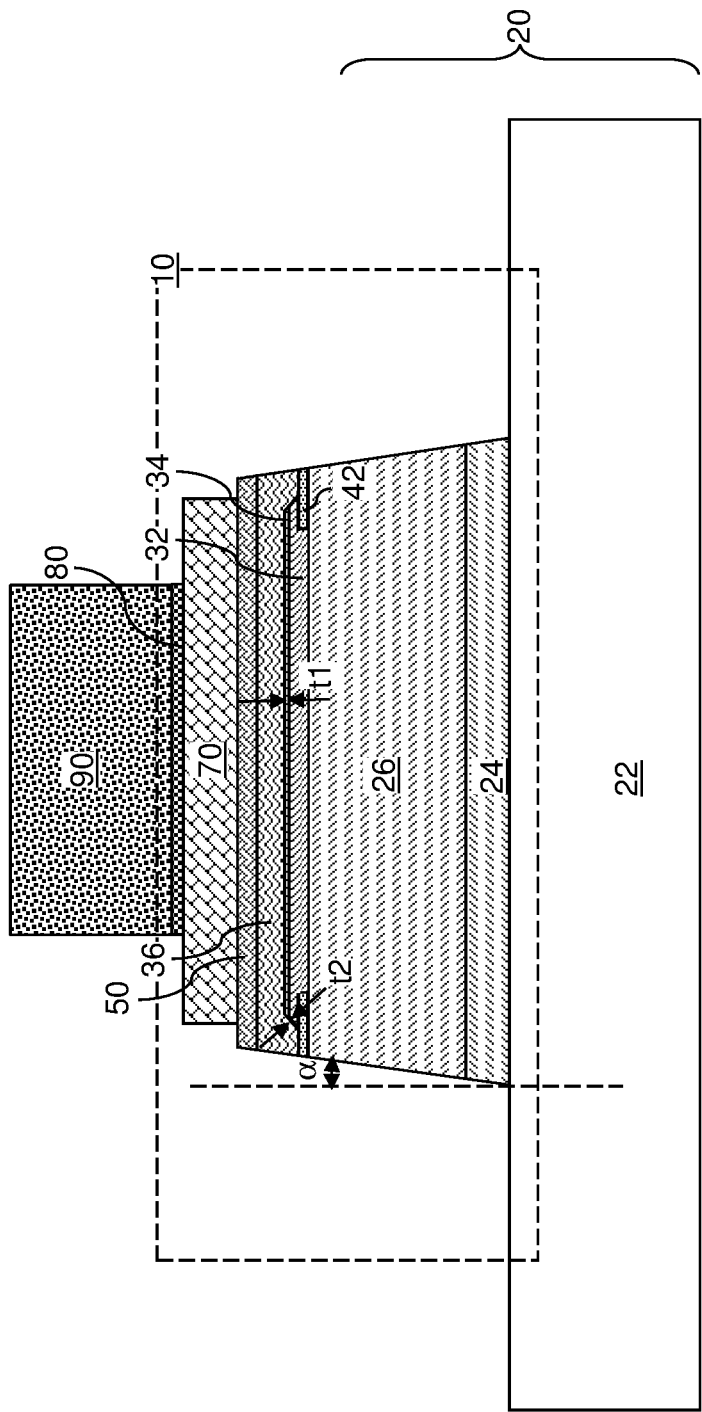
FIG. 2A is a vertical cross-sectional view of a first configuration of a light emitting diode according to an embodiment of the present disclosure.
Figure 3A:
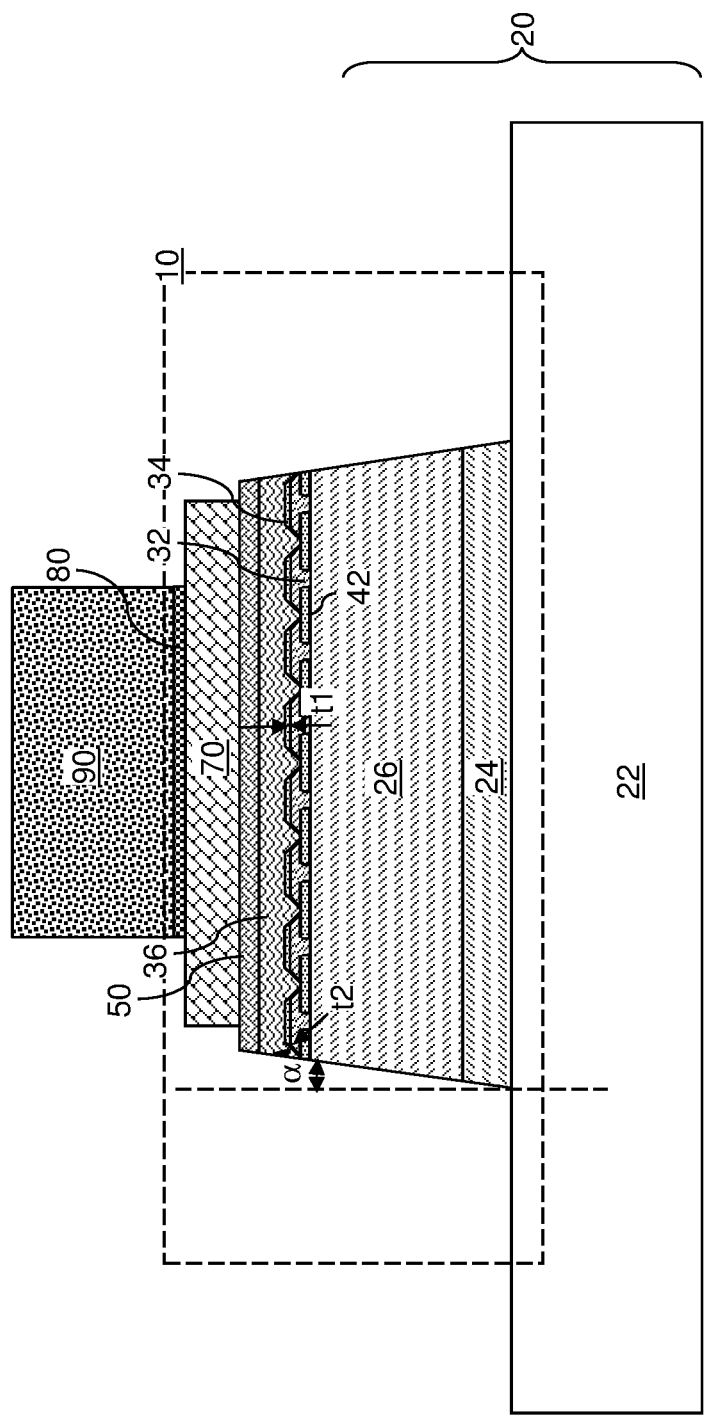
FIG. 3A is a vertical cross-sectional view of a third configuration of a light emitting diode according to an embodiment of the present disclosure.
Figure 3B:
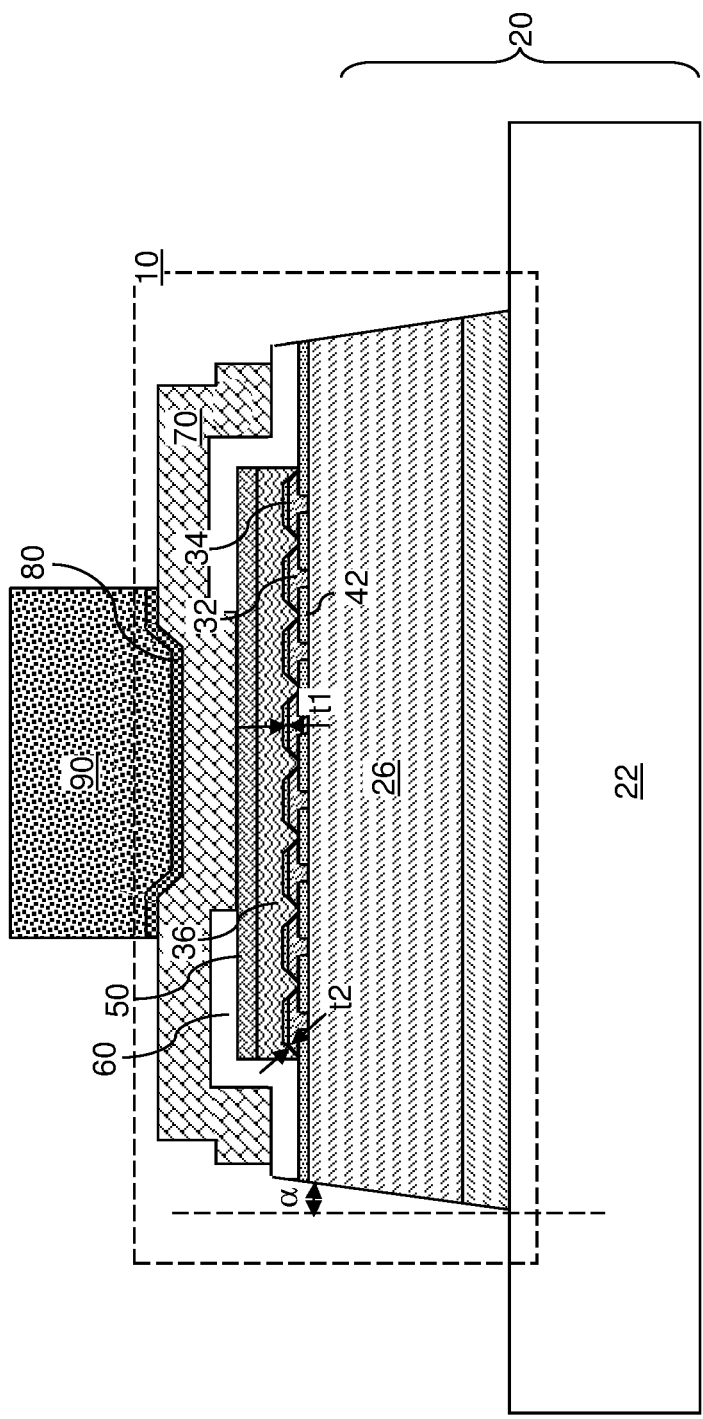
FIG. 3B is a vertical cross-sectional view of a fourth configuration of a light emitting diode according to an embodiment of the present disclosure.
Figure 4A:
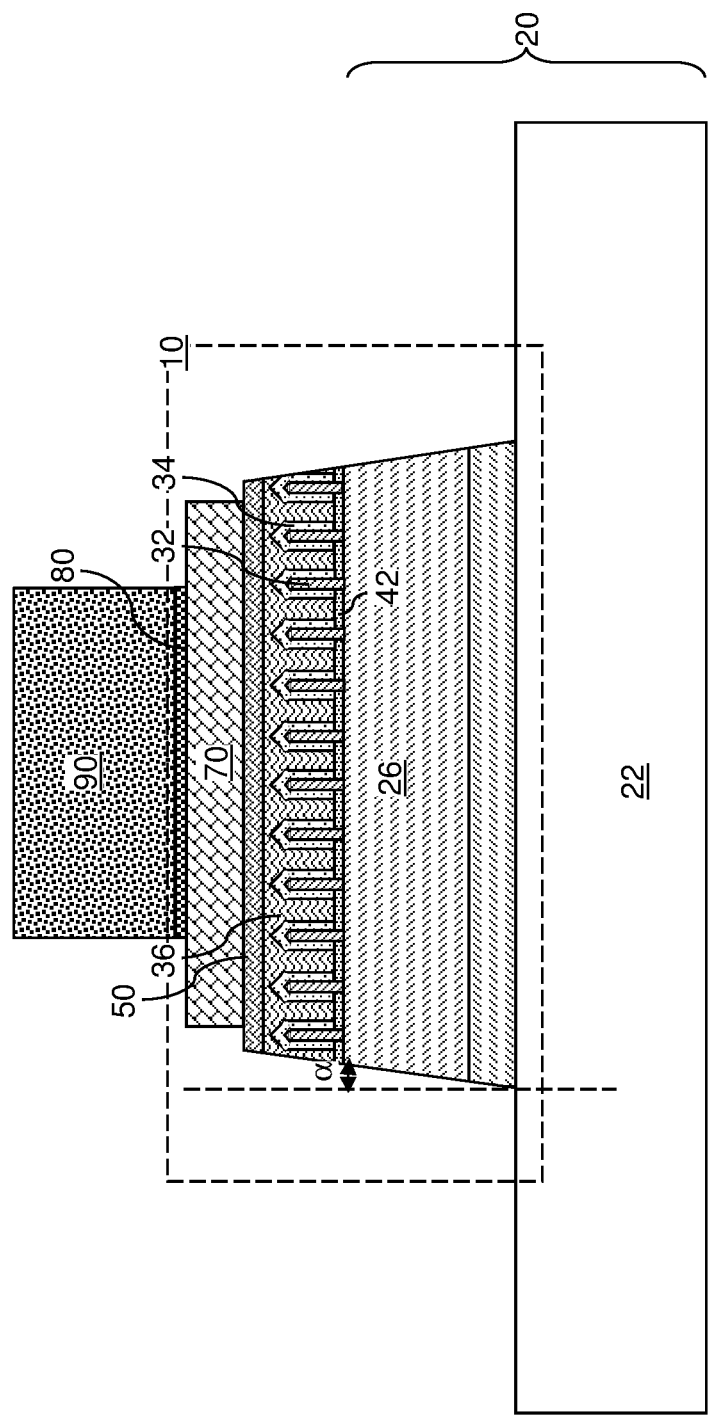
FIG. 4A is a vertical cross-sectional view of a fifth configuration of a light emitting diode according to an embodiment of the present disclosure.
Figure 4B:
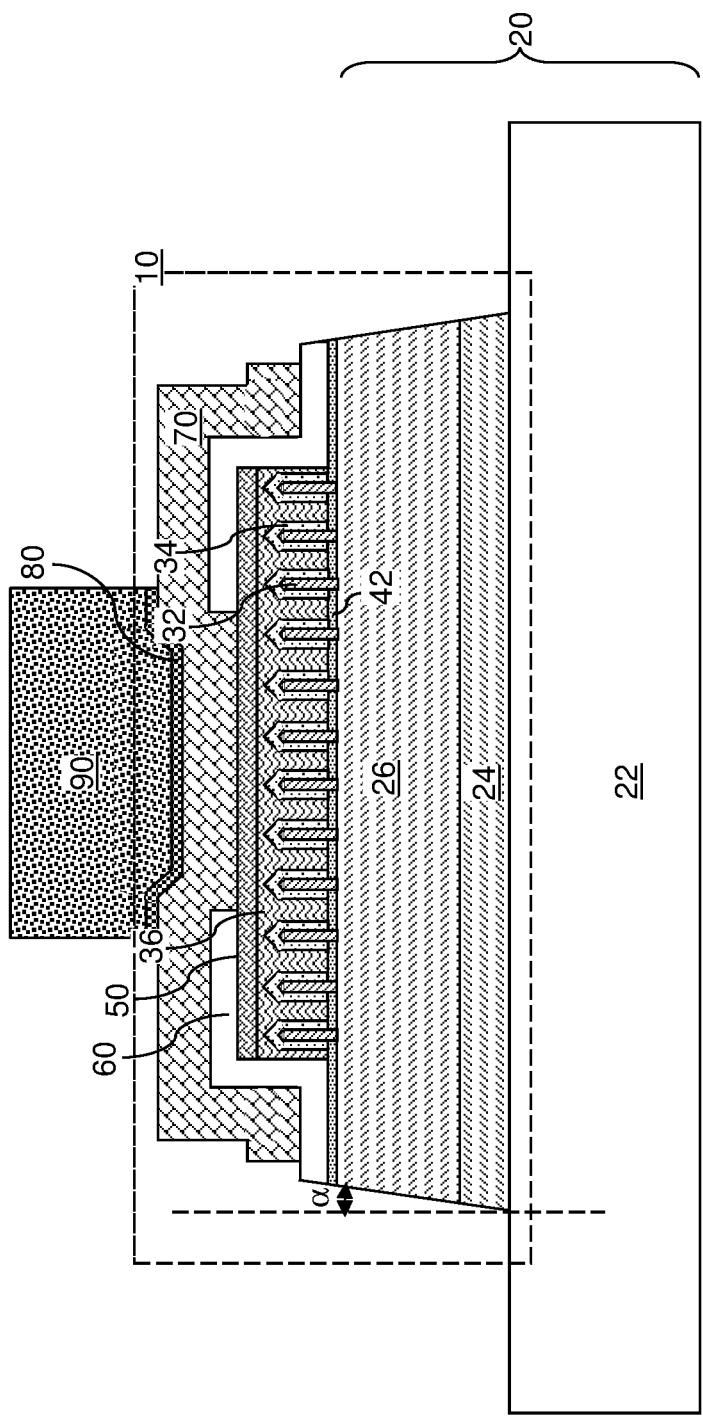
FIG. 4B is a vertical cross-sectional view of a sixth configuration of a light emitting diode according to an embodiment of the present disclosure.
Figure 5A:
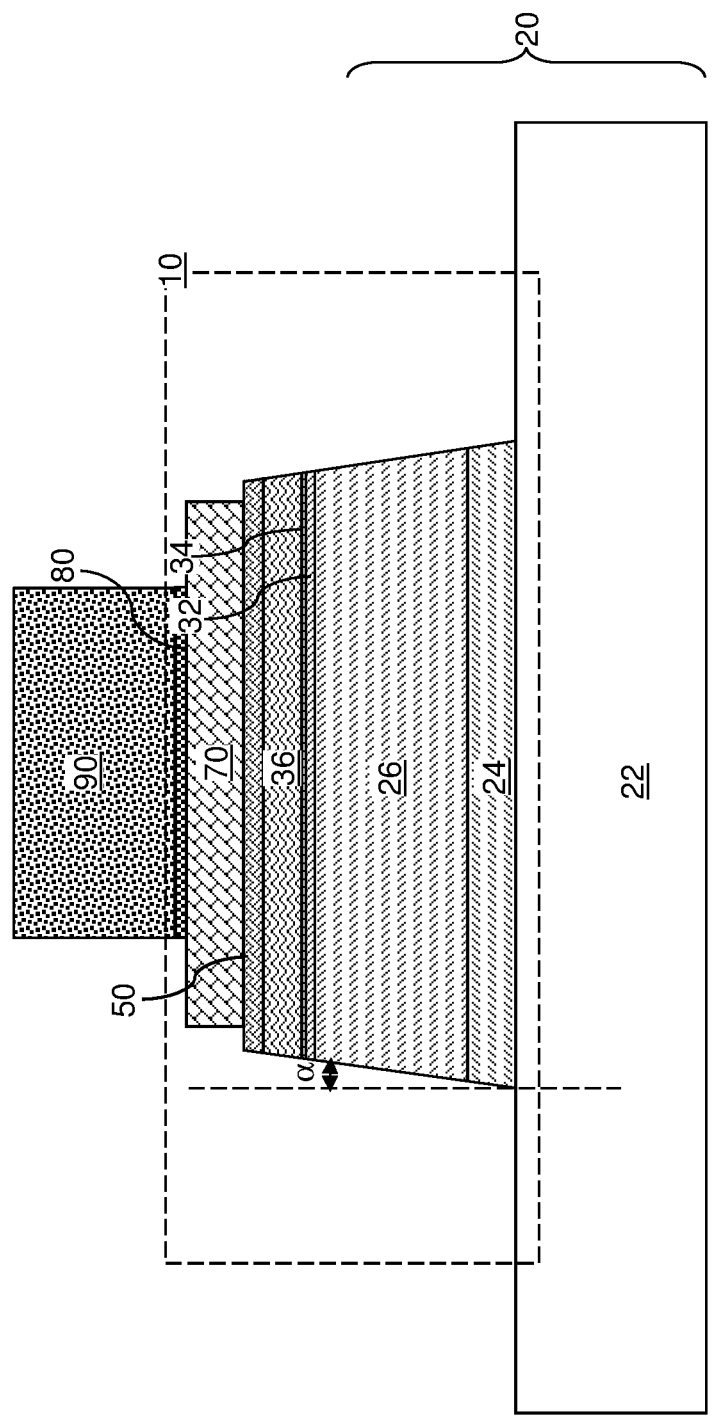
FIG. 5A is a vertical cross-sectional view of a seventh configuration of a light emitting diode according to an embodiment of the present disclosure.

In configurations such as the configurations of FIGS. 2A and 2B, each area for a light emitting diode 10 includes a respective single opening in the patterned growth mask layer 42. In configurations such as the configurations of FIGS. 3A, 3B, 4A, and 4B, each area for a light emitting diode 10 includes a respective array of openings in the patterned growth mask layer 42.

In some other embodiments (such as the embodiments illustrated in FIGS. 5A and 5B), the patterned growth mask layer 42 is not employed. In this case, continuous planar semiconductor layers are formed on the n-doped compound semiconductor substrate layer 26.

N-doped compound semiconductor regions 32 can be grown through, and over, the growth mask layer 42 by a selective compound semiconductor deposition process, which can be a selective epitaxy process. The shapes and sizes of the n-doped compound semiconductor regions 32 can be determined based on the shapes and dimensions of the openings through the growth mask layer 42 and by the process conditions of the selective compound semiconductor deposition process. The n-doped compound semiconductor regions 32 can be formed with various crystallographic facets located within a respective crystallographic plane. As used herein, a "p-plane" means a "pyramid plane," which can by any of the $\{1\bar{1}01\}$ planes in the III-nitride system, a "c-plane" represents a $\{0001\}$ plane, and an "m-plane" represents any of the $\{1\bar{1}00\}$ planes. Growth rates generally differ among the different crystallographic planes. A "growth rate" herein means a layer growth rate along the direction perpendicular to a growth surface when not otherwise specified. In one embodiment, the top surface of the n-doped compound semiconductor substrate layer 26 can be within a c-plane. The height of each n-doped compound semiconductor region 32 can be in a range from 50 nm to 10 microns, such as from 200 nm to 2 microns, although lesser and greater heights can also be employed. In some embodiments, an anneal at an elevated temperature that induces migration of deposited semiconductor materials, a partial etch back process, and/or chemical mechanical planarization process may be optionally employed to provide planar top surfaces and/or faceted surfaces.

In some embodiments (such as the embodiments illustrated in FIGS. 2A and 2B), the n-doped compound semiconductor regions 32 can be formed as microdiscs. As used herein, a disc refers to a structural element having a top surface and a bottom surface that are parallel to each other and the area of the top surface is greater than the total area of surfaces (such as faceted surfaces or sidewall surfaces) that are not parallel to the top surface. A "microdisc" refers to a disc for which the maximum lateral dimension of the top surface is at least 1 micron and is less than 1 mm. A microdisc may have a circular, oval or polygonal (e.g., rectangular, hexagonal, etc.) when viewed from above.

In some embodiments (such as the embodiments illustrated in FIGS. 3A and 3B), the n-doped compound semiconductor regions 32 can be formed as nanodiscs. A "nanodisc" refers to a disc for which the maximum lateral dimension of the top surface is at least 1 nm and less than 1 micron. A cluster of microdiscs or nanodiscs can be formed for each area of a light emitting diode 10.

In some embodiments (such as the embodiments illustrated in FIGS. 4A and 4B), the n-doped compound semiconductor regions 32 can be formed as nanowire cores, microwire cores, nanopyramids, micropyramids, nanofrustums, microfrustums, combinations thereof, or other nanoscale structures or microscale structures. A "nanowire" refers to a structure extending along a lengthwise direction (such as a vertical direction) and having a maximum vertical dimension that is greater than a maximum lateral dimension that is at least than 1 nm and less than 1 micron, and including a region of a substantially uniform cross-sectional shape along the direction perpendicular to the lengthwise direction. A "microwire" refers to a structure extending along a lengthwise direction (such as a vertical direction) and having a maximum vertical dimension that is greater than a maximum lateral dimension that is at least 1 micron and less than 1 mm, and including a region of a substantially uniform cross-sectional shape along the direction perpendicular to the lengthwise direction. A "nanopyramid" refers to a conical structure having a base of a polygonal or otherwise generally curvilinear shape such that the maximum lateral dimension of the base is at least than 1 nm and less than 1 micron. A "micropyramid" refers to a conical structure having a base of a polygonal or otherwise generally curvilinear shape such that the maximum lateral dimension of the base is at least than 1 micron and less than 1 mm. A "nanofrustum" refers to a frustum (i.e., a conical structure without a region around an apex) having a base of a polygonal or otherwise generally curvilinear shape such that the maximum lateral dimension of the base is at least than 1 nm and less than 1 micron. A "microfrustum" refers to a frustum having a base of a polygonal or otherwise generally curvilinear shape such that the maximum lateral dimension of the base is at least than 1 micron and less than 1 mm. If the top surface of the n-doped compound semiconductor substrate layer 26 is within a c-plane, the nanowires and the microwires may include m-planes, p-planes, and optionally a respective c-plane. The nanopyramids, the micropyramids, the nanofrustums, and the microfrustums may include p-planes. The nanofrustums and the microfrustums may include c-planes.

Selective epitaxy processes that may be employed to form the n-doped compound semiconductor regions 32 are described, for example, in U.S. Pat. No. 9,444,007 to Krylouk et al., U.S. Pat. No. 9,419,183 to Lowgren et al., U.S. Pat. No. 9,281,442 to Romano et al., and U.S. Pat. No. 8,669,574 to Konsek et al., each of which is assigned to Glo AB and is incorporated herein by reference in their entirety.

In some embodiments (such as the embodiments illustrated in FIGS. 5A and 5B), the epitaxy of the n-doped compound semiconductor region 32 may be performed without employing a patterned growth mask layer 42 on all physically exposed surfaces of an array of patterned portions of the n-doped compound semiconductor substrate layer 26. In this embodiment, n-doped compound semiconductor region 32 comprises a continuous planar semiconductor layer.

Subsequently, an active region 34 including an optically active compound semiconductor layer stack configured to emit light is formed on each n-doped compound semiconductor region 32. Each active region 34 includes at least one semiconductor material that emits light upon application of a suitable electrical bias. For example, each active region 34 can include a single or a multi-quantum well (MQW) structure that emits light upon application of an electrical bias thereacross. For example, the quantum well(s) may comprise indium gallium nitride well(s) located between gallium nitride or aluminum gallium nitride barrier layers. Alternatively, the active regions 34 can include any other suitable semiconductor layers (e.g., such as gallium phosphide or its ternary or quarternary compounds) or stack of layers for light emitting diode applications provided that it can be grown on the surfaces of the n-doped compound semiconductor regions 32. The set of all layers within an active region 34 is herein referred to as an active layer.

In one embodiment, each of the plurality of active regions 34 includes a respective optically active compound semiconductor layer stack configured to emit light. In a non-limiting illustrative example, the active region 34 can include a layer stack including, from bottom to top, a silicon-doped GaN layer having a thickness of 30 nm to 70 nm, such as about 50 nm to about 60 nm, a GaN layer having a thickness of 2 nm to 10 nm, such as about 5 nm to 7 nm, an InGaN layer having a thickness of 1 nm to 5 nm, such as about 3 nm to 4 nm, and a GaN barrier layer having a thickness of 10 nm to 30 nm, such as about 15 nm to 20 nm. Optionally, an AlGaN cap layer may be formed on the InGaN layer for red LEDs. The sequence of layers, composition of each layer, and the thickness of each layer within each active region 34 can be optimized to increase emission intensity and to provide the target peak emission wavelength. The active regions 34 may emit any color light, such as blue, green or red light depending on the composition of the semiconductor material therein and the strain that is applied to the semiconductor material.

A selective epitaxy process can be employed to grow the active regions 34. The process parameters of the selective epitaxy process can be selected such that the active regions 34 are grown as conformal structures having a same thickness throughout. In another embodiment, the active regions 34 can be grown as a pseudo-conformal structure in which the horizontal portions have the same thickness (such as a first thickness t1) throughout, and faceted portions have a thickness (such as a second thickness t2) that is less than the thickness of the horizontal portions. In one embodiment, each of the plurality of active regions 34 can include a top planar portion having the first thickness t1 and sidewall portions overlying tapered planar sidewalls of a respective one of the n-doped compound semiconductor regions 32 and having the second thickness t2. In one embodiment, the ratio of the first thickness t1 to the second thickness t2 can be in a range from 2 to 50, although lesser and greater ratios can also be employed. Methods for growing a layer stack for active regions 34 on nanowires are described, for example, in U.S. Pat. No. 9,444,007 to Krylouk et al., U.S. Pat. No. 9,419,183 to Lowgren et al., U.S. Pat. No. 9,281,442 to Romano et al., and U.S. Pat. No. 8,669,574 to Konsek et al. An active region 34 contacts, surrounds, and overlies an underlying n-doped compound semiconductor region 32. In some embodiment shown in FIGS. 2A, 2B, 5A and 5B, a single active region 34 can be formed per light emitting diode 10. In other embodiments shown in FIGS. 3A, 3B, 4A, and 4B, a cluster of active regions 34 can be formed per light emitting diode 10.

A p-doped semiconductor material layer 36 is formed on the planar top surfaces and faceted outer surfaces of the active regions 34. The p-doped semiconductor material layer 36 includes a doped semiconductor material having a doping of a second conductivity type, which is the opposite of the first conductivity type. For example, if the first conductivity type is n-type, then the second conductivity type is p-type. If the first conductivity type is p-type, then the second conductivity type is n-type.

The p-doped semiconductor material layer 36 can include a compound semiconductor material. The compound semiconductor material of the p-doped semiconductor material layer 36 can be any suitable semiconductor material, such as p-type III-nitride compound semiconductor material, e.g., gallium nitride and/or aluminum gallium nitride. In one embodiment, the n-doped compound semiconductor regions 32 can include n-doped GaN or InGaN, and the p-doped semiconductor material layer 36 can include p-doped AlGaN and/or GaN. Alternatively, n-doped compound semiconductor regions 32 and/or the p-doped semiconductor material layer 36 can include other semiconductor materials, such as such as gallium phosphide or its ternary or quarternary compounds.

The p-doped semiconductor material layer 36 can be formed by selective deposition of the doped semiconductor material on the outer surfaces of the active regions 34. For example, a selective epitaxy process can be employed. During the selective deposition process (which can be a selective epitaxy process), discrete semiconductor material portions grow from the outer surfaces of each of the active regions until the discrete semiconductor material portions merge to form the p-doped semiconductor material layer 36 as a continuous semiconductor material layer within the area of each light emitting diode 10. In case portions of the top surface of the growth mask layer 42 are not covered by the n-doped compound semiconductor regions 32 or the active regions 34, the bottom surface of the p-doped semiconductor material layer 36 may contact such portions of the top surface of the growth mask layer 42.

An anode contact 50 can be formed on the top surface of the p-doped semiconductor material layer 36. Various configurations for the p-doped semiconductor material layer 36 can be incorporated into any of the light emitting diodes 10 illustrated in FIGS. 2A, 2B, 3A, 3B, 4A, 4B, 5A, and 5B.

In one embodiment, the anode contact 50 can include a layer stack including a high reflectivity material. The anode contact 50 can include one or more of a nickel layer, a platinum layer, a silver layer, and/or an aluminum layer. The layers of the anode contact 50 may be formed by conformal or non-conformal deposition. The thickness of the layers of the anode contact 50 can be in a range from 10 nm to 600 nm, such as from 100 nm to 300 nm, although lesser and greater thicknesses can also be employed.

In another embodiment, the anode contact 50 can include a layer stack including an adhesion metal layer and a silver layer. The combination of the adhesion metal layer and the silver layer provides good adhesion of the reflective material layer 70 to be subsequently formed to the p-doped semiconductor material layer 36 as well as good electrical contact to the p-doped semiconductor material layer 36. The adhesion metal layer directly contacts the p-doped semiconductor material layer 36. The material of the adhesion metal layer can be an elemental metal that promotes adhesion. For example, the adhesion metal layer can be a platinum layer consisting essentially of platinum or a nickel layer consisting essentially of nickel. The adhesion metal layer can be deposited, for example, by physical vapor deposition. The thickness of the adhesion metal layer (as measured over a horizontal surface) can be in a range from 0.2 nm to 6 nm, such as from 0.5 nm to 2 nm, although lesser and greater thicknesses can also be employed. The silver layer can consist essentially of silver, and can be formed, for example, by physical vapor deposition. The thickness of the silver layer (as measured over a horizontal surface) can be in a range from 20 nm to 300 nm, such as from 90 nm to 150 nm, although lesser and greater thicknesses can also be employed. An aluminum layer may be employed in lieu of, or in addition to, the silver layer. Optionally, a metal cap layer consisting essentially of another elemental metal, such as platinum, having a thickness of 5 nm to 25 nm, such as 10 nm to 20 nm can be formed on the silver layer or the aluminum layer. In an illustrative example, the anode contact can include a stack, from bottom to top, of a bottom platinum layer, a silver layer, and a top platinum layer.

A photoresist layer can be applied over the anode contact 50, and is lithographically patterned to cover each discrete area that corresponds to the area of a light emitting diode 10. The photoresist layer can include a two-dimensional array of discrete portions that are laterally spaced apart among one another. For example, two sets of line trenches extending along orthogonal horizontal directions can be provided among the patterned portions of the photoresist layer. An anisotropic etch process can be performed to etch through unmasked portions of the anode contact 50, the p-doped semiconductor material layer 36, the active region 34, the n-doped compound semiconductor region(s) 32, the n-doped compound semiconductor substrate layer 26, and the single crystalline buffer semiconductor layer 24. The multiple etch steps can be employed to etch through the various material portions. Each of the anode contact 50, the p-doped semiconductor material layer 36, the active region 34, the n-doped compound semiconductor region(s) 32, the n-doped compound semiconductor substrate layer 26, and the single crystalline buffer semiconductor layer 24 is divided into multiple discrete portions that underlie a respective one of the patterned portions of the photoresist layer. Thus, the stack of the anode contact 50, the p-doped semiconductor material layer 36, the active region 34, the n-doped compound semiconductor region(s) 32, the n-doped compound semiconductor substrate layer 26, and the single crystalline buffer semiconductor layer 24 is patterned by a combination of a lithographic process and an anisotropic etch process. The photoresist layer can be subsequently removed. In an alternative embodiment, the anode contact 50 may be patterned by a lift-off process, in which case the photoresist is deposited and patterned, followed by depositing the anode contact layer or layers over the photoresist patterns and on the p-doped semiconductor material layer 36 exposed between the photoresist patterns, and followed by lifting off the photoresist patterns and the anode contact layer or layers located over the photoresist patterns to form the patterned anode contact 50. The patterned anode contact 50 may be formed before or after patterning the stack of the p-doped semiconductor material layer 36, the active region 34, the n-doped compound semiconductor region(s) 32, the n-doped compound semiconductor substrate layer 26, and the single crystalline buffer semiconductor layer 24 into respective light emitting diodes 10.

Each continuous set of remaining portions of the anode contact 50, the p-doped semiconductor material layer 36, the active region 34, the n-doped compound semiconductor region(s) 32, the n-doped compound semiconductor substrate layer 26, and the single crystalline buffer semiconductor layer 24 constitute components of a respective light emitting diode 10. The sidewalls of the n-doped compound semiconductor substrate layer 26 and the single crystalline buffer semiconductor layer 24 of each light emitting diode 10 can be formed with a finite taper angle $\alpha$. The taper angle $\alpha$ can be in a range from 1 degree to 15 degrees, such as from 2 degrees to 10 degrees and/or from 3 degrees to 6 degrees, although lesser and greater taper angles can also be employed. In one embodiment, the contiguous sets of components of light emitting diodes 10 can be formed as a two-dimensional rectangular array. In this case, each contiguous set of components of a light emitting diode 10 can include four pairs of tapered sidewalls that defines a lateral boundary of a stack of an anode contact 50, the p-doped semiconductor material layer 36, an active region 34, an n-doped compound semiconductor region(s) 32, an n-doped compound semiconductor substrate layer 26, and a single crystalline buffer semiconductor layer 24. The photoresist layer can be subsequently removed.

An optional dielectric material layer 60 can be subsequently formed on the physically exposed surfaces of the exemplary structure in the embodiments of FIGS. 2B, 3B 4B, and 5B. The dielectric material layer 60 includes a dielectric (electrically insulating) material such as aluminum oxide, silicon oxide, silicon nitride, organosilicate glass, silicone, a resin, a self-planarizing dielectric material, or another dielectric material. In one embodiment, the dielectric material layer 60 can be formed by a conformal deposition process such as low pressure chemical vapor deposition (LPCVD). Alternatively, the dielectric material layer 60 can be formed by plasma enhanced chemical vapor deposition (PECVD), atomic layer deposition (ALD) or spin-coating. The thickness of the portion of the dielectric material layer 60 that overlies horizontal surfaces of the anode contact 50 can be in a range from 50 nm to 1,000 nm, such as from 100 nm to 500 nm, although lesser and greater thicknesses can also be employed.

The dielectric material layer 60 can be subsequently patterned to provide an opening above each anode contact 50. For example, a hard mask layer including a dielectric material (such as silicon nitride or a dielectric metal oxide) can be applied over the exemplary structure, and can be lithographically patterned to form openings within each periphery of the anode contacts 50 using a photoresist layer, which is subsequently removed by using a solvent. An anisotropic etch process or an isotropic etch process can be performed employing the hard mask layer as an etch mask layer. For example, if the dielectric material layer 60 includes silicon oxide, an isotropic etch process employing dilute hydrofluoric acid can be employed to form openings through the dielectric material layer 60. The area of each opening through the dielectric material layer 60 may be in a range from 10% to 90% of the area of an underlying anode contact 50. The sidewalls of the dielectric material layer 60 around the openings may be tapered or may be vertical. The hard mask layer can be subsequently removed, for example, by a selective etch process. For example, if the hard mask layer includes silicon nitride, a wet etch employing hot phosphoric acid or a mixture of hydrofluoric acid and ethylene glycol may be employed to selectively remove silicon nitride while minimizing removal of silicon oxide. Alternatively, a patterned photoresist layer may be used as a mask instead of the patterned hard mask layer. In this case, the patterned photoresist layer can be removed after the etch process using a solvent.

If the anode contact 50 is not reflective, then an optional reflective metal layer 70 can be subsequently formed. In some configurations, the reflective metal layer 70 is formed as a planar structure that entirely overlies the top surface of an underlying anode contact 50. In such configurations, the entirety of the reflective material layer 70 is more distal from the n-doped compound semiconductor substrate layer 26 than a most distal surface of the n-doped compound semiconductor region 32 is from the n-doped compound semiconductor substrate layer 26 within each light emitting diode 10. In such embodiments, the reflective material layer 70 may have a smaller area than the anode contact 50.

Alternatively, the reflective metal layer 70 may be formed with a laterally-extending portion that is more distal from the n-doped compound semiconductor substrate layer 26 than a most distal surface of the p-doped semiconductor material layer 36 (which is in contact with an anode contact 50) is from the n-doped compound semiconductor substrate layer 26, and a sidewall portion adjoined to a periphery of the laterally-extending portion, extending downward therefrom, and laterally surrounding the n-doped compound semiconductor region 32, the n-doped compound semiconductor substrate layer 26, and the single crystalline buffer semiconductor layer 24 of the same light emitting device 10.

Generally, the reflective material layer 70 can be patterned to provide a suitable lateral extent for each light emitting diode 10. A combination of a photolithographic patterning and an etch process (such as an anisotropic etch process or an isotropic etch process) can be employed. Optionally, patterning of the reflective material layer 70 and the dielectric material layer 60 may be performed employing a same patterned photoresist layer as an etch mask.

Bonding pads 80 including an underbump metallurgy (UBM) layer stack can be formed on each reflective material layer 70 (or on each anode contact 50 in case the reflective material layer 70 is not employed). The UBM layer stack can include any metallic layer stack known in the art that can be employed as a bonding pad structure that enables attachment of a solder material thereupon. A solder material portion 90 can be subsequently attached to each bonding pad 80 employing methods known in the art.

Light emitting diodes 10 provided on at least one source substrate 22 can be transferred to, and bonded to, a backplane. Methods for transferring light emitting diodes to a backplane are disclosed, for example, in U.S. Patent Application Nos. 2019/0109262, 2019/0088820, 2018/0366450, 2018/0198047, 2018/0114878, 2017/0373046, 2017/0346011, 2017/0227816, 2017/0068038, and 2007/0210315, each of which is incorporated herein by reference in its entirety.

Figure 6A:
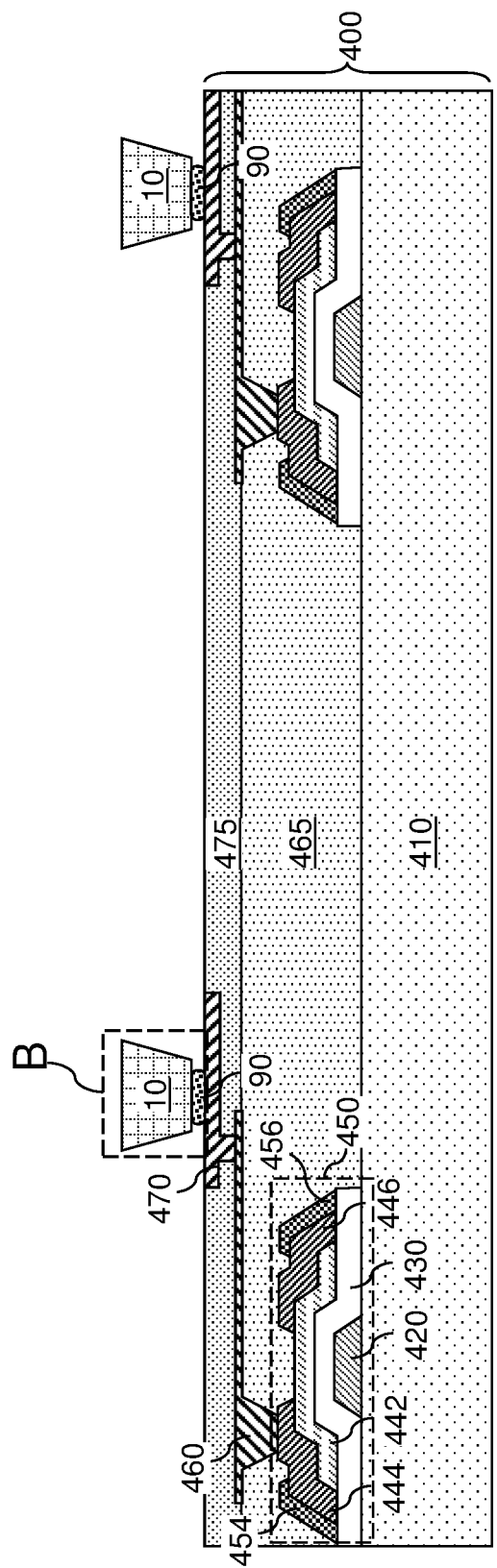
FIG. 6A is a vertical cross-sectional view of an array region of a first exemplary structure after forming an array of light emitting diodes on a backplane according to a first embodiment of the present disclosure.
Figure 6B:
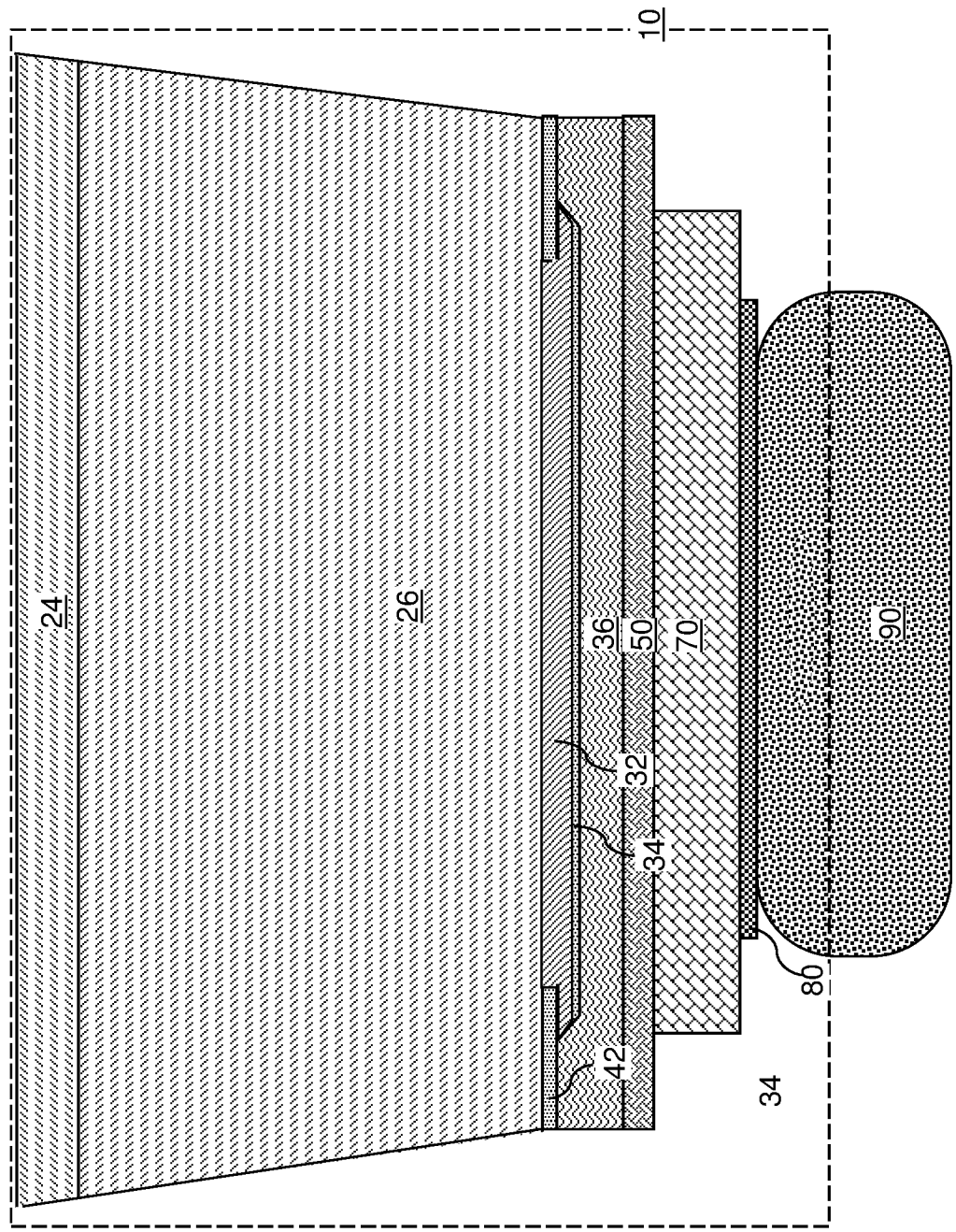
FIG. 6B is a magnified view of the region B in FIG. 6A.
Figure 6C:
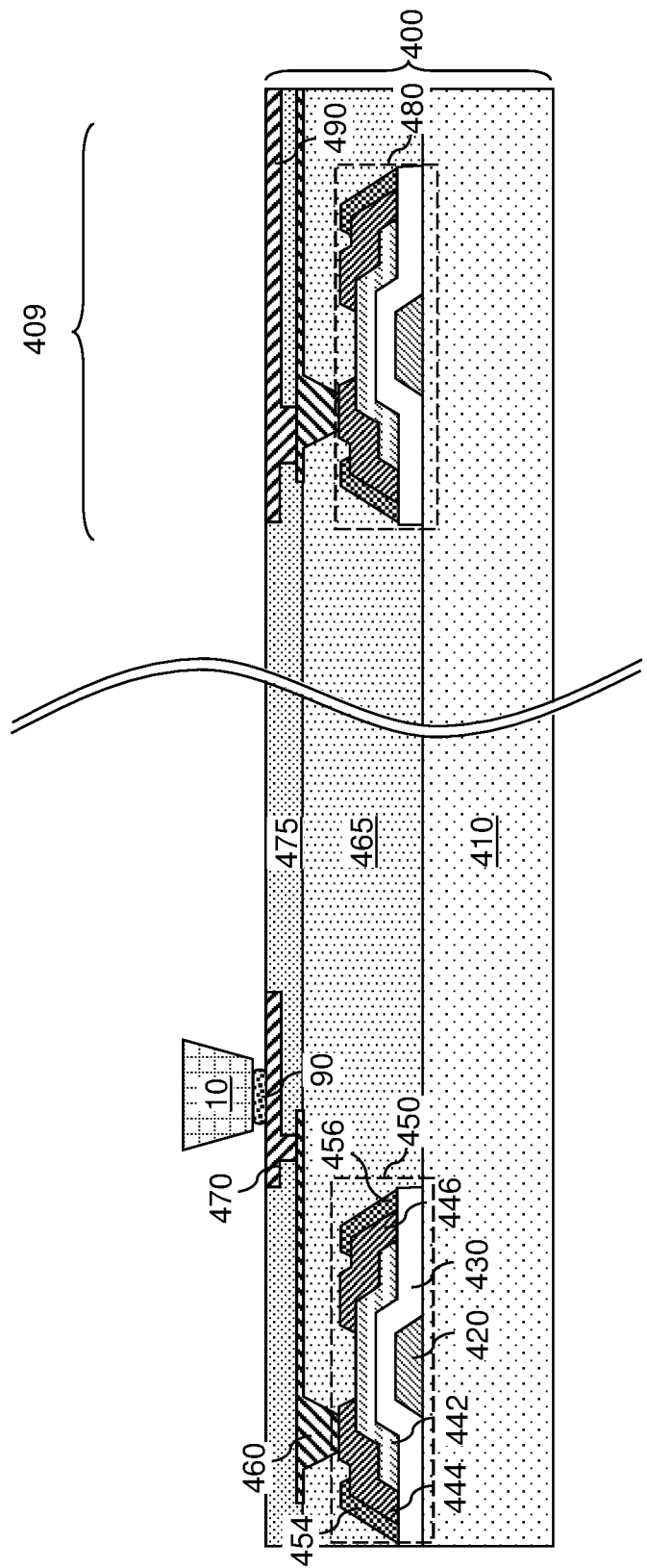
FIG. 6C is a vertical cross-sectional view of a peripheral region of the first exemplary structure at the processing step of FIG. 6A.
Figure 6D:
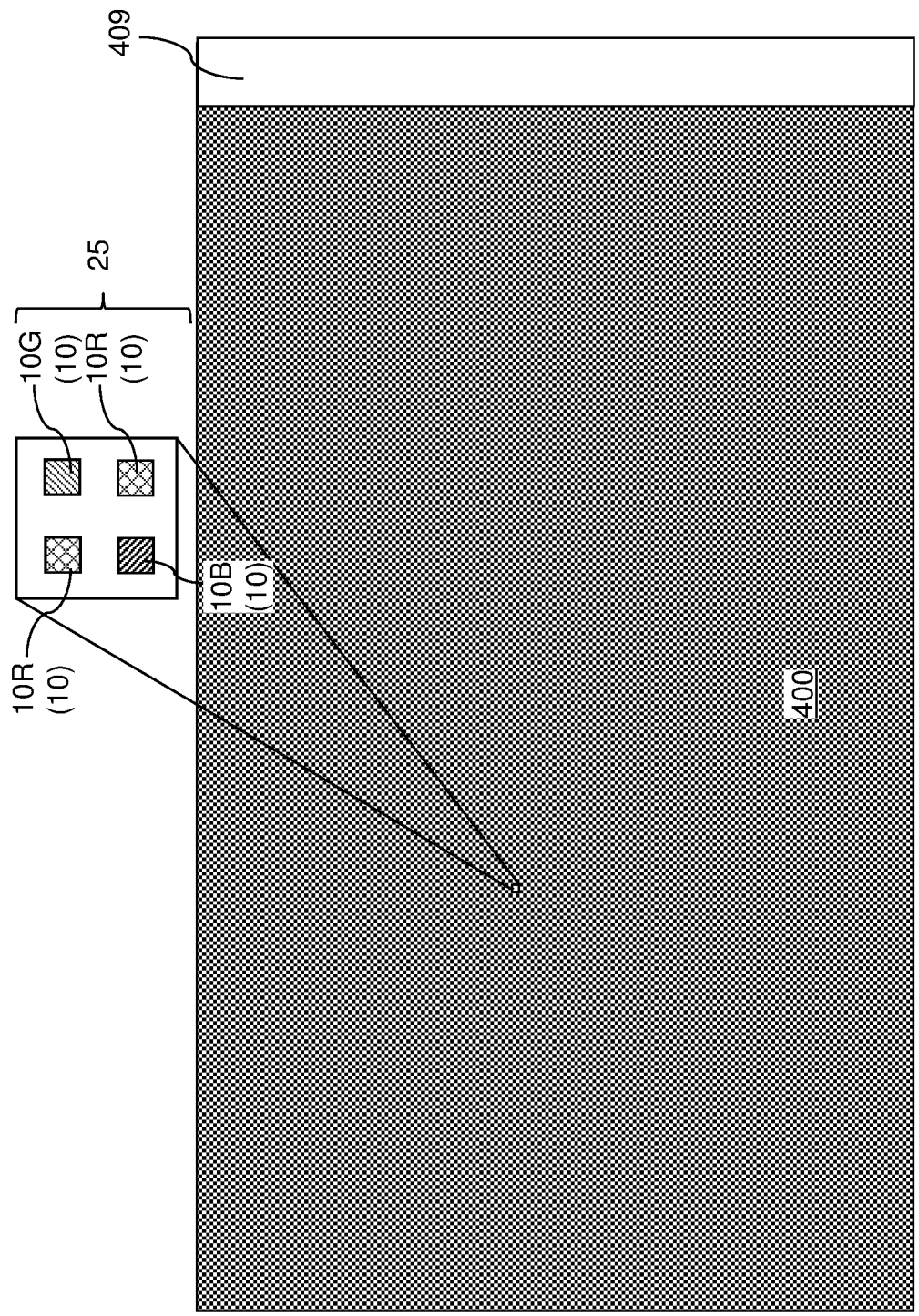
FIG. 6D is a top-down view of the first exemplary structure of FIGS. 6A-6C.

Referring to FIG. 6A, in an illustrative example, an assembly of the transparent single crystalline substrate 22 and an array of light emitting diodes 10 attached thereto is flipped upside down, and is disposed over the backplane 400. Each solder material portion 90 on a light emitting diode 10 that needs to be attached to the backplane 400 can be reflowed so that an overlying light emitting diode 10 is bonded to the backplane. The reflow may be conducted by heating the solder material portion 90 by irradiating by an infrared laser beam through the backplane 400 or through the LEDs 10 onto the solder material portion 90 or by annealing the device in a furnace or similar heating apparatus above the melting temperature of the solder material portion 90. Solder material portions 90 that underlie light emitting diodes 10 that do not need to be transferred to the backplane are not irradiated by the infrared laser beam or these solder material portions 90 have a composition with a higher melting point than the furnace anneal temperature.

Portions of the single crystalline buffer semiconductor layer 24 that overlie attached light emitting diodes 10 are sequentially irradiated by a high power laser beam, such as an ultraviolet, visible, or infrared light laser beam, through the transparent single crystalline substrate 22 to remove surface portions of the single crystalline buffer semiconductor layer 24. Thus, each light emitting diode 10 that is soldered to the backplane 400 can be detached from the transparent single crystalline substrate 22 by a laser lift off process.

Referring to FIGS. 6A-6D, a first exemplary structure according to a first embodiment of the present disclosure includes a backplane 400 and an array of light emitting diodes 10 attached to a frontside of the backplane 400 through an array of solder contacts, such as solder material portions 90. The array of light emitting diodes 10 can be arranged as an array of pixels 25 within an array region.

Each pixel 25 can include multiple subpixels. Each subpixel can include at least one light emitting diode 10.

Each subpixel may include a single light emitting diode 10, or may include a plurality of light emitting diodes 10. In an illustrative example, each pixel 25 can include a blue subpixel, a green subpixel, and two red subpixels. In another illustrative example, each pixel 25 can include a blue subpixel, two green subpixels, and a red subpixel. In another illustrative example, each pixel 25 can include a blue subpixel, a green subpixel, a red subpixel and an optional empty repair site for mounting a repair LED. Each blue subpixel can include a blue-light-emitting diode 10B, which is a first-type light emitting diode among the light emitting diodes 10. Each green subpixel can include a green-light-emitting diode 10G, which is a second-type light emitting diode among the light emitting diodes 10. Each red subpixel can include a red-light-emitting diode 10R, which is a third-type light emitting diode among the light emitting diodes 10. The backplane 400 may include a peripheral region 409, which can be employed to provide various contact structures (e.g., wire bond contact structures or other suitable contact structures) to electrically connect the various nodes of the backplane 400 to power supply nodes and signal nodes of an external device that can drive the light emitting diodes 10 on the backplane 400.

The backplane 400 includes a backplane substrate 410, which can be an insulating substrate. A control circuitry for controlling operation of the light emitting devices 10 attached to the backplane 400 may be provided within the backplane. For example, switching devices 450 can be provided within the backplane 400. In an illustrative example, the switching devices 450 can include field effect transistors, such as thin film transistors (TFTs). In this case, each field effect transistor 450 may include a gate electrode 420, a gate dielectric 430, a channel region 442, a source region 446, and a drain region 444. While an inverted staggered TFT is shown herein, other types of TFTs, such as inverted coplanar, top gated staggered and top gated coplanar TFTs can be used instead. Various electrical wirings can be provided to interconnect the various electrical nodes of the field effect transistors to electrical interfaces (not expressly shown) on the backplane 400. Source interconnect wiring 456 and drain interconnect wiring 454 are illustrated. Additional interconnect wiring may be provided as needed. The switching devices 450 can be encapsulated by an encapsulation dielectric layer 465. First-level metal interconnect structures 460 can be formed through the encapsulation dielectric layer 465 to a node of a respective switching device 450 such as a drain region 444. An interconnect level dielectric layer 475 may be formed over the encapsulation dielectric layer 465, and second-level metal interconnect structures 470 can be formed through the interconnect level dielectric layer 475 on the first-level metal interconnect structures 460. The second-level metal interconnect structures 470 can include an array of bonding pads for attaching the array of light emitting diodes 10.

The peripheral region 409 of the backplane can include an input/output (I/O) switching device 480, metal interconnect structures electrically connected thereto, and peripheral connection pads 490 (which are also referred to as input/output (I/O) pads). The peripheral connection pads 490 can be subsequently employed to provide external electrical connection to the backplane 400. For example, the peripheral connection pads 490 may be bonding pads including a respective underbump metallurgy (UBM) stack for attaching a respective solder material portion. Alternatively, the peripheral connection pads may include metallic contact pads that can slide into a connection slot in a multi-slot connector configured to provide electrical connection through physical contact.

Generally, an array of light emitting diodes 10 can be attached to a frontside of a backplane 400. Sidewalls of the light emitting diodes 10 can be reverse-tapered. As used herein, a "reverse-tapered" sidewall refers to a sidewall that is tilted toward a reference structure from which an element including the sidewall protrudes. In the case of the first exemplary structure, each light emitting diode 10 can have sidewalls that are tilted toward the backplane with reference to the surface normal of the frontside surface of the backplane 400, such that the bottom surface of the light emitting diode 10 facing the backplane 400 is narrower than the top surface facing away from the backplane 400. As discussed above, the tilt angle of the sidewalls of the light emitting diodes 10 can be in a range from 1 degree to 15 degrees, such as from 2 degrees to 10 degrees and/or from 3 degrees to 6 degrees. Thus, in one embodiment, each light emitting diode 10 can have a variable horizontal cross-sectional area that increases with a vertical distance from the frontside surface of the backplane 400 upon attaching the array of light emitting diodes 10 to the frontside of the backplane 400.

Figure 7:
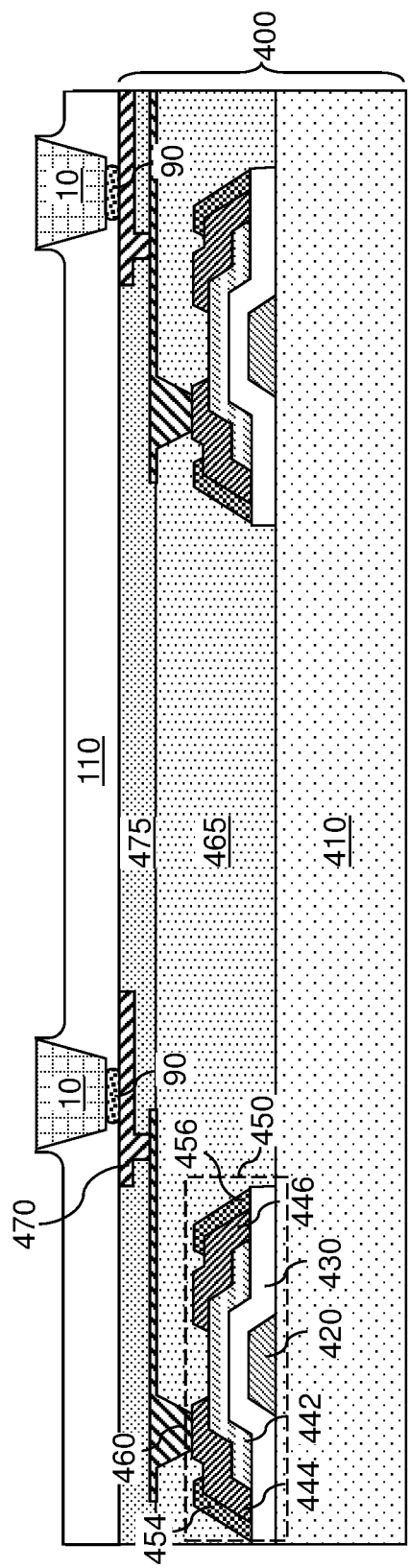
FIG. 7 is a vertical cross-sectional view of the array region of the first exemplary structure after application of a positive photoresist layer according to the first embodiment of the present disclosure.

Referring to FIG. 7, a positive tone, imageable dielectric material layer 110 can be applied over the frontside surface of the backplane 400 and over the light emitting diodes 10. Layer 110 may comprise a spin-on dielectric material. In one embodiment, layer 110 may comprise a positive photoresist layer 110. The positive photoresist layer 110 can be applied by spin-coating with a sufficient thickness to fill the space between adjacent light emitting diodes 10 bonded to the backplane 400. The positive photoresist layer 110 is a polymer deposited in the cross-linked state that can be dissociated (i.e., uncross-linked) upon irradiation with radiation. Surface tension in the cross-linked polymer material of the positive photoresist layer 110 naturally planarizes the positive photoresist layer 10 between the protruding light emitting diodes 10. In one embodiment, a top surface of the portions of the positive photoresist layer 110 located between the light emitting diodes 10 is located below a horizontal plane including top surfaces of the light emitting diodes 10. Thus, only a relatively thin film of positive photoresist may be formed on top of the light emitting diodes 10.

According to an embodiment of the present disclosure, use of a positive tone, imageable dielectric material layer, such as a positive photoresist material, provides a non-limiting advantage over use of a negative photoresist material, which is deposited in the uncross-linked state, and needs to be exposed to radiation to form a stable cross-linked polymer material. Specifically, the entirety of the positive tone, imageable dielectric material layer, such as the positive photoresist layer 110 can include the cross-linked polymer upon formation. In contrast, irradiation of a negative photoresist material with radiation (e.g., UV radiation) along a vertical direction is not sufficient to induce cross-linking of shaded regions of a negative photoresist material within regions that underlie the overhanging portions of the reverse-tapered light emitting diodes 10 (i.e., regions adjacent to sidewalls of the light emitting diodes 10). In other words, portions of the negative photoresist material that underlie the reverse-tapered sidewalls of the light emitting diodes 10 are not exposed to radiation due to the shading of the radiation that impinges along a vertical direction (i.e., perpendicular to top surface of the backplane 400) on the negative photoresist layer. These shaded portions of the negative photoresist remain uncross-linked and subsequently form undesirable voids adjacent to the sidewalls of the light emitting diodes 10 in the completed device. By using a positive tone, imageable dielectric material layer, such as a positive photoresist material, that provides an as-deposited cross-linked polymer in all regions (including regions shaded by the overhanging portions of the light emitting diodes 10), a chemically stable material junction can be formed between the sidewalls of the light emitting diodes 10 and positive tone, imageable dielectric material layer, such as the positive photoresist layer 110, which provides a seamless interface between sidewalls of the light emitting diodes 10 and the positive tone, imageable dielectric material layer, such as the positive photoresist layer 110, even after a recess etch process to be subsequently performed.

Generally, the positive tone, imageable dielectric material layer, such as the positive photoresist layer 110 includes a cross-linked polymer that can dissociate upon irradiation with ultraviolet light. After spin-coating and drying, the positive tone, imageable dielectric material layer, such as the positive photoresist layer 110 may have a transparency of 90% or greater, such as 90 to 98%, and water absorption less than 0.2%, such as 0.001% to 0.1% at room temperature and in an ambient at 1 atmospheric pressure. In some embodiments, residual stress of the positive tone, imageable dielectric material layer, such as the positive photoresist layer 110 after spin-coating and drying can be less than about 30 MPa, such as 10 to 25 MPa, and elongation at break may be less than about 13%, such as 8 to 12% (e.g., flexible enough not to crack under normal processing but not too flexible to avoid overexpansion which would pull the LEDs 10 off the backplane 400). Dielectric constant of the positive tone, imageable dielectric material layer, such as the positive photoresist layer 110 at 1 MHz may be in a range from 2 to 6, such as from 2 to 4. Dielectric breakdown voltage of the positive tone, imageable dielectric material layer, such as the positive photoresist layer 110 may be greater than 4 MV/cm, such as 5 to 10 MV/cm. Refractive index of the positive tone, imageable dielectric material layer, such as the positive photoresist layer 110 may be in a range from 1.4 to 1.8, and the tensile stress applied by the positive tone, imageable dielectric material layer, such as the positive photoresist layer 110 may be less than 80 MPa. The positive tone, imageable dielectric material layer, such as the positive photoresist layer should have sufficient adhesion to the LEDs 10, such as sufficient adhesion to the GaN material of the LEDs if the GaN material is exposed on the LED sidewalls. In an illustrative example, ZC100-T positive photoresist material from Zeon Corporation can be employed for the positive tone, imageable dielectric material layer 110.

In one embodiment, the thickness of the positive tone, imageable dielectric material layer, such as the positive photoresist layer 110 can be selected such that the top surface of the portions of the positive tone, imageable dielectric material layer, such as the positive photoresist layer 110 located between the LEDs 10 after spin-coating and curing is located below a horizontal plane including the top surfaces of the light emitting diodes. In an illustrative example, the lowest point of the top surface of the cured positive tone, imageable dielectric material layer, such as the positive photoresist layer 110 can be located below the horizontal plane including the top surfaces of the light emitting diodes 10 by a height in a range from 1 micron to 3 microns. The positive tone, imageable dielectric material layer, such as the positive photoresist layer 110 can physically contact all physically exposed surfaces of the light emitting diodes 10 and all physically exposed portions of the frontside surface of the backplane 400.

Figure 8:
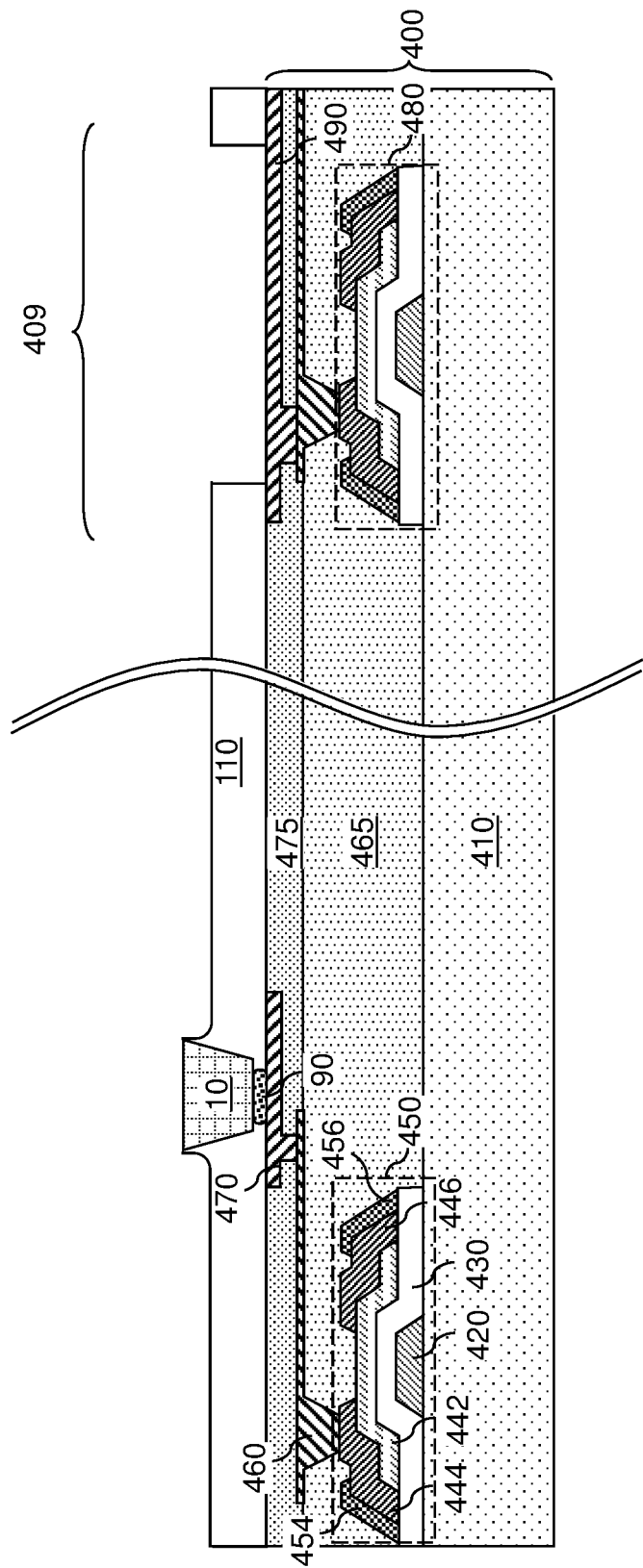
FIG. 8 is a vertical cross-sectional view of the array region of the first exemplary structure after lithographically patterning the positive photoresist layer according to the first embodiment of the present disclosure.

Referring to FIG. 8, the positive tone, imageable dielectric material layer, such as the positive photoresist layer 110 can be lithographically exposed in the peripheral region 409. For example, portions of the positive tone, imageable dielectric material layer, such as the positive photoresist layer 110 located in the peripheral region 409 within the areas that overlie the peripheral connection pads (e.g., cathode connection pads) 490 can be irradiated with ultraviolet light employing mid-ultraviolet (MUV) lithographic exposure process. The cross-linked polymer material in the lithographically exposed portions of the positive tone, imageable dielectric material layer, such as the positive photoresist layer 110 becomes uncross-linked, thereby becoming susceptible to dissolution in a solvent. The uncross-linked polymer material in the lithographically exposed portions of the positive tone, imageable dielectric material layer, such as the positive photoresist layer 110 is then dissolved in a subsequent development process to physically expose the frontside surfaces of the peripheral connection pads 490 in the peripheral region 409. The entirety of the array region remains covered with a remaining continuous portion of the positive tone, imageable dielectric material layer, such as the positive photoresist layer 110.

Figure 9A:
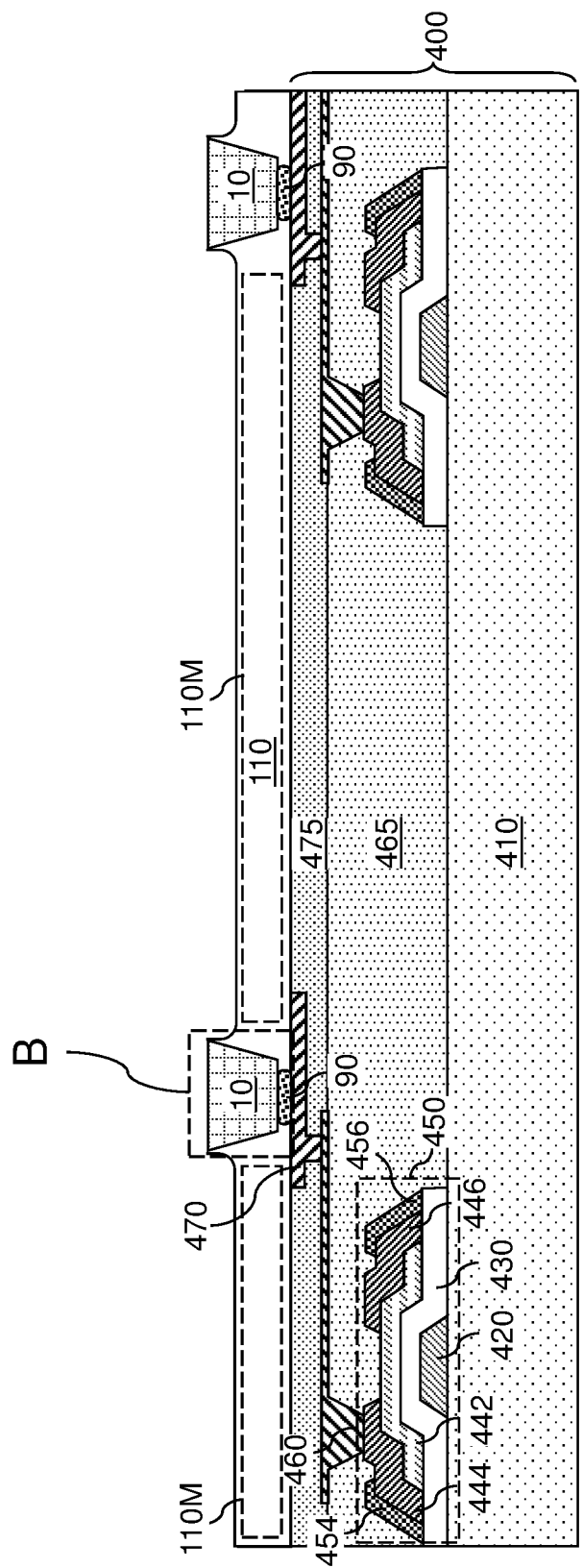
FIG. 9A is a vertical cross-sectional view of the array region of the first exemplary structure after vertically recessing the positive photoresist layer according to the first embodiment of the present disclosure.
Figure 9B:
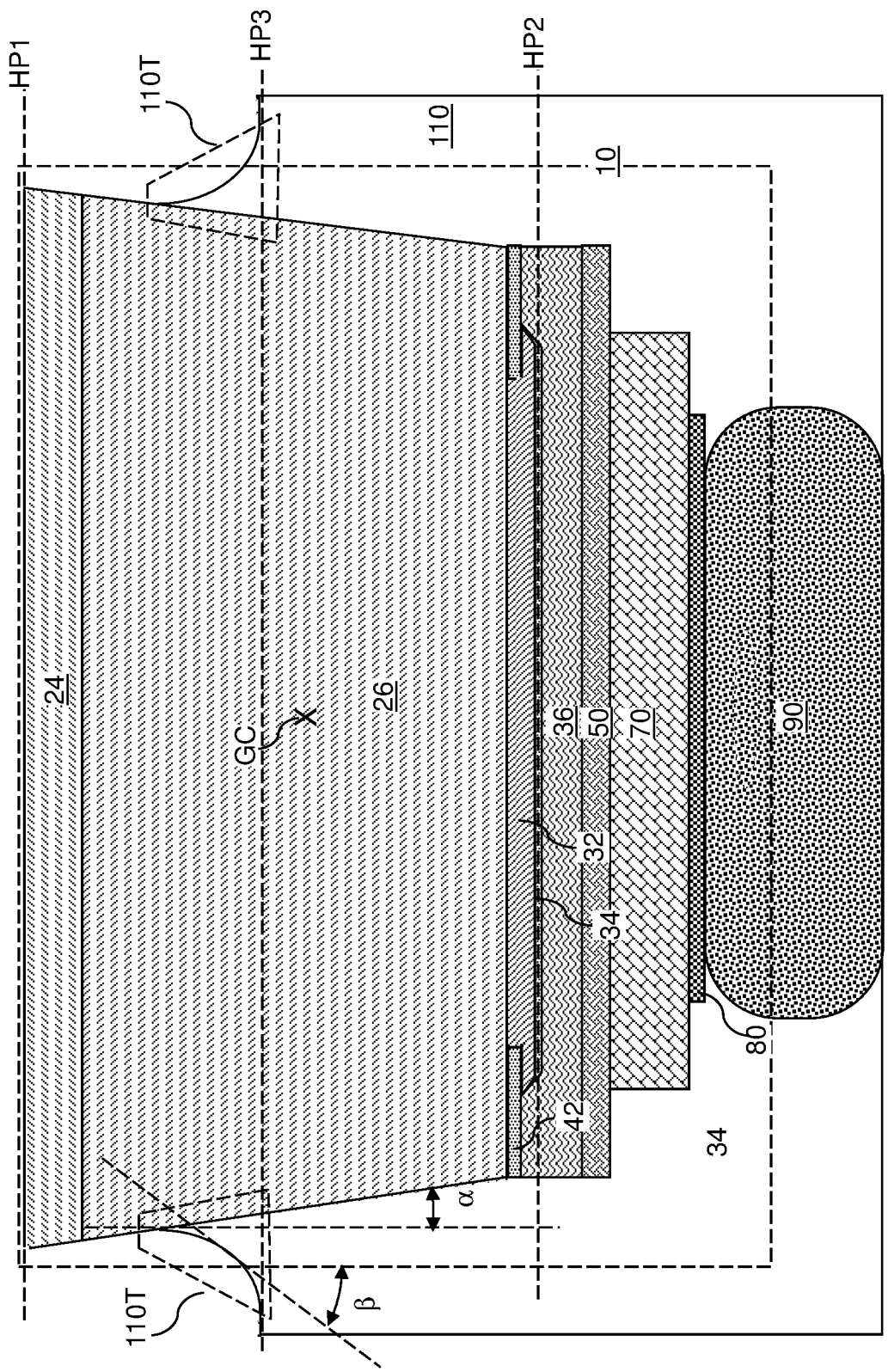
FIG. 9B is a magnified view of the region B in FIG. 9A.
Figure 9C:
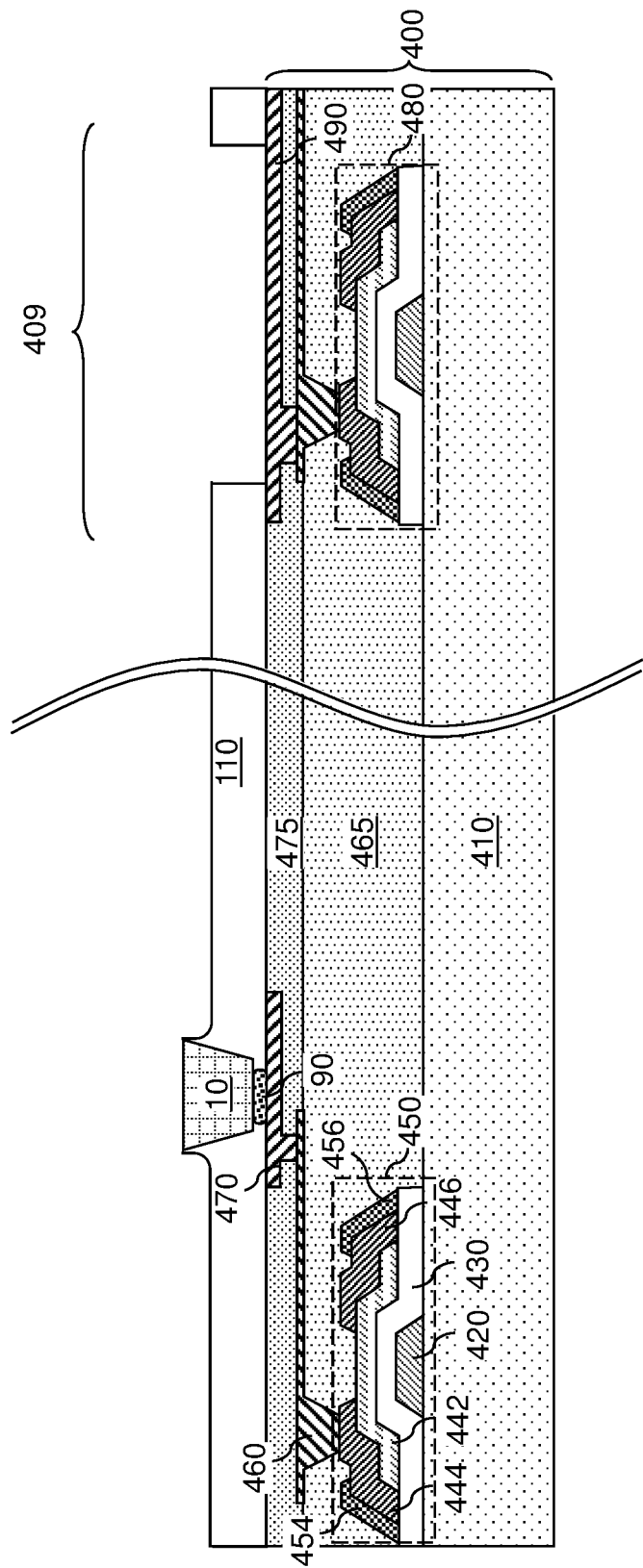
FIG. 9C is a vertical cross-sectional view of a peripheral region of the first exemplary structure at the processing step of FIG. 9A.

Referring to FIGS. 9A-9C, an upper portion of the positive tone, imageable dielectric material layer, such as the positive photoresist layer 110 may be removed. In one embodiment, the upper portion of the positive tone, imageable dielectric material layer, such as the positive photoresist layer 110 may be removed using an unmasked, timed photoresist ash process that removes only the top portions of the positive tone, imageable dielectric material layer, such as the positive photoresist layer 110. Alternatively, the upper portion of the positive photoresist layer 10 may be removed by a short blanket radiation exposure, i.e., irradiation of ultraviolet radiation over the entire area of the backplane 400 for a duration that causes uncross-linking of the cross-linked polymer only in the upper portion of the positive tone, imageable dielectric material layer, such as the positive photoresist layer 110. The duration of the blanket exposure is selected such that the much thicker lower portion of the positive tone, imageable dielectric material layer, such as the positive photoresist layer 110 is underexposed. If employed, the blanket exposure process may be performed before or after the patterned lithographic exposure process of FIG. 8. The uncross-linked upper portion of the positive tone, imageable dielectric material layer, such as the positive photoresist layer 110 can be subsequently removed by development in a solvent.

The positive tone, imageable dielectric material layer, such as the positive photoresist layer 110 can be uniformly recessed vertically at least until all top surfaces of the light emitting diodes 10 are physically exposed. Generally, the positive tone, imageable dielectric material layer, such as the positive photoresist layer 110 can be vertically recessed such that a top surface of all regions of the positive photoresist layer 110 is formed below a first horizontal plane HP1 including top surfaces of the light emitting diodes 10. In one embodiment, the positive photoresist layer can be recessed such that a flat portion of the top surface of the photoresist layer 110 that are not shaded by peripheral portions of the light emitting diodes 10 are located at a depth in a range from 1 micron to 5 microns, such as from 1 micron to 3 microns below the first horizontal plane HP1. In one embodiment, each of the light emitting diodes 10 comprises a respective active region 34 configured to emit light upon application of a bias voltage thereacross. In one embodiment, the top surface of the positive tone, imageable dielectric material layer, such as the positive photoresist layer 110 can be formed between the first horizontal plane HP1 and a second horizontal plane HP2 including the active regions 34 of the light emitting diodes 10 after vertically recessing the positive tone, imageable dielectric material layer, such as the positive photoresist layer 110.

In one embodiment, sidewalls of the light emitting diodes contacting the positive tone, imageable dielectric material layer, such as the positive photoresist layer have a respective reentrant vertical cross-sectional profile. As used herein, a "reentrant vertical cross-sectional profile" of an element refers to a vertical cross-sectional profile in which a surface of the element shifts inward with an increase in depth from a top surface. Thus, an object with a re-entrant vertical cross-sectional profile has a greater lateral extent at top and a lesser lateral extent at the bottom. Therefore, the positive tone, imageable dielectric material layer, such as the positive photoresist layer has total horizontal cross-sectional area that decreases with a vertical distance from the backplane 400 from the horizontal plane including the interfaces between the n-doped compound semiconductor substrate layer 26 and the n-doped compound semiconductor region 32 of each light emitting diode 10 to the first horizontal plane HP1.

Portions of the positive tone, imageable dielectric material layer, such as the positive photoresist layer 110 underlying peripheral portions of top surfaces (i.e., the physically exposed surfaces of each single crystalline buffer semiconductor layer 24) of the light emitting diodes 10 may be shielded during the blanket exposure process (that uncrosslinks the cross-linked polymer in the positive tone, imageable dielectric material layer, such as the positive photoresist layer 110 as originally formed). Thus, portions of the positive tone, imageable dielectric material layer, such as the positive photoresist layer 110 underlying peripheral portions of top surfaces are not removed during a development process, which removes lithographically exposed upper portions of the positive photoresist layer 110. In other words, the light emitting diodes 10 provide geometrical shielding of surrounding portions of the positive tone, imageable dielectric material layer, such as the positive photoresist layer 110 during the blanket exposure process so that portions of the positive photoresist layer 110 that are shielded by upper surfaces of the light emitting diodes 10 are not removed during the development process. Remaining portions of the positive tone, imageable dielectric material layer, such as the positive photoresist layer 110 after the recess process comprises tapered encirclement portions 110T that laterally encircle and contact a sidewall of a respective one of the light emitting diodes 10. A matrix portion 110M of the positive tone, imageable dielectric material layer, such as the positive photoresist layer 110 adjoin the tapered encirclement portions 110T and continuously extend around each of the light emitting diodes 10. The top surface of the matrix portion 110M of the positive tone, imageable dielectric material layer, such as the positive photoresist layer 110 can be located within a third horizontal plane HP3 located between the first horizontal plane HP1 and the second horizontal plane HP2. In one embodiment, the second horizontal plane HP2 can intersect each n-doped compound semiconductor substrate layer 26 of the light emitting diodes 10.

In one embodiment, the light emitting diodes 10 comprises a respective n-doped compound semiconductor substrate layer 26 having a horizontal cross-sectional area that strictly increases with a distance from the frontside of the backplane 400. As used herein, "strict increase" means a property of a function in which each increase in an independent variable results in an increase in the value of the function. In this case, each increase in the distance from the frontside of the backplane 400 results in an increase in the horizontal cross-sectional area of each n-doped compound semiconductor substrate layer 26. In one embodiment, the light emitting diodes 10 comprises a respective single crystalline buffer semiconductor layer 24 that contacts an upper surface of the respective n-doped compound semiconductor substrate layer 26 and having a graded semiconductor composition. In one embodiment, all top surfaces and all sidewalls of each single crystalline buffer semiconductor layer 24 can be physically exposed.

Each tapered encirclement portion 110T laterally encircles and contacts a respective one of the light emitting diodes 10. Each tapered encirclement portion 110T includes a respective set of inner sidewalls (i.e., sidewalls contacting the respective one of the light emitting diodes 10) and a respective set of outer sidewalls (i.e., physically exposed sidewalls that are portions of the physically exposed top surface of the positive tone, imageable dielectric material layer, such as the positive photoresist layer 110). A lateral spacing between each of the inner sidewalls and a most proximal one of the outer sidewalls decreases to zero with an increase in a vertical distance from the backplane 400. In one embodiment, the inner sidewalls of the tapered encirclement portions 110T can have a uniform taper angle α in a range from 1 degree to 15 degrees with respective to a direction perpendicular to a frontside surface of the backplane 400 (i.e., with respective to the vertical direction), the outer sidewalls of the tapered encirclement portions 110T include concave sidewalls having a variable taper angle β that increases with a lateral distance from a geometrical center GC of a most proximal one of the light emitting diodes 10. As used herein, a geometrical center of an object refers to the center of gravity of a hypothetical object occupying the same volume as the object and having a uniform density throughout.

In one embodiment, the vertical height of each physically exposed portion of sidewalls of the n-doped compound semiconductor substrate layer 26 of each light emitting diode 10 may be in a range from 0.5 micron to 4 microns, such as from 1 micron to 3 microns, although lesser and greater vertical heights can be employed for physically exposed portions of the sidewalls of the n-doped compound semiconductor substrate layers 26. The positive tone, imageable dielectric material layer, such as the positive photoresist layer 110 remains in the final device and is used as an insulating spacer during operation of the device (e.g., when then LEDs 10 emit light).

Optionally, the single crystalline buffer semiconductor layer 24 may be removed before, after and/or during recessing of the positive tone, imageable dielectric material layer, such as the positive photoresist layer 110. Furthermore, the exposed top surfaces of the LEDs 10 (e.g., either the top surface of the single crystalline buffer semiconductor layer 24 if it is not removed or the top surface of the n-doped compound semiconductor substrate layers 26 if layer 24 is removed) may be roughened to increase emission of light through the top surfaces of the light emitting diodes 10 (by reducing light reflection at the interface between the light emitting diodes 10 and a conductive adhesion layer to be subsequently formed).

Figure 10A:
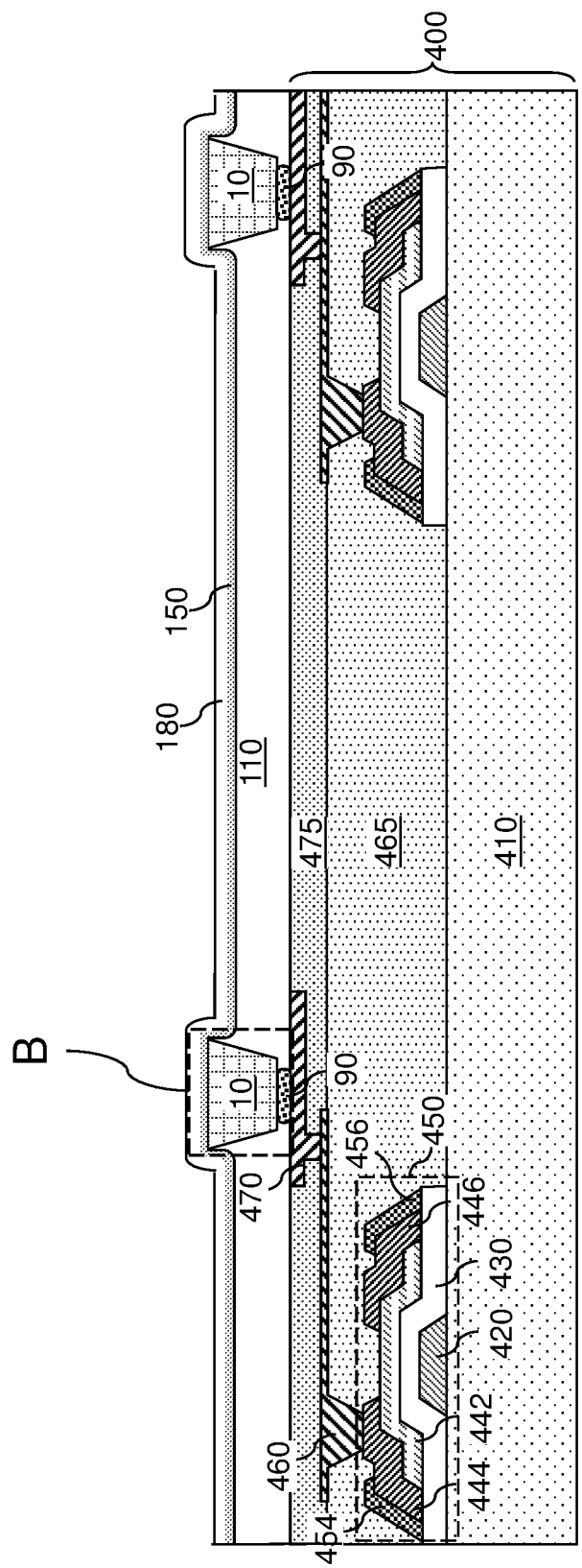
FIG. 10A is a vertical cross-sectional view of the array region of the first exemplary structure after formation of a conductive adhesion layer, a transparent conductive layer, and bonding structures according to the first embodiment of the present disclosure.
Figure 10B:
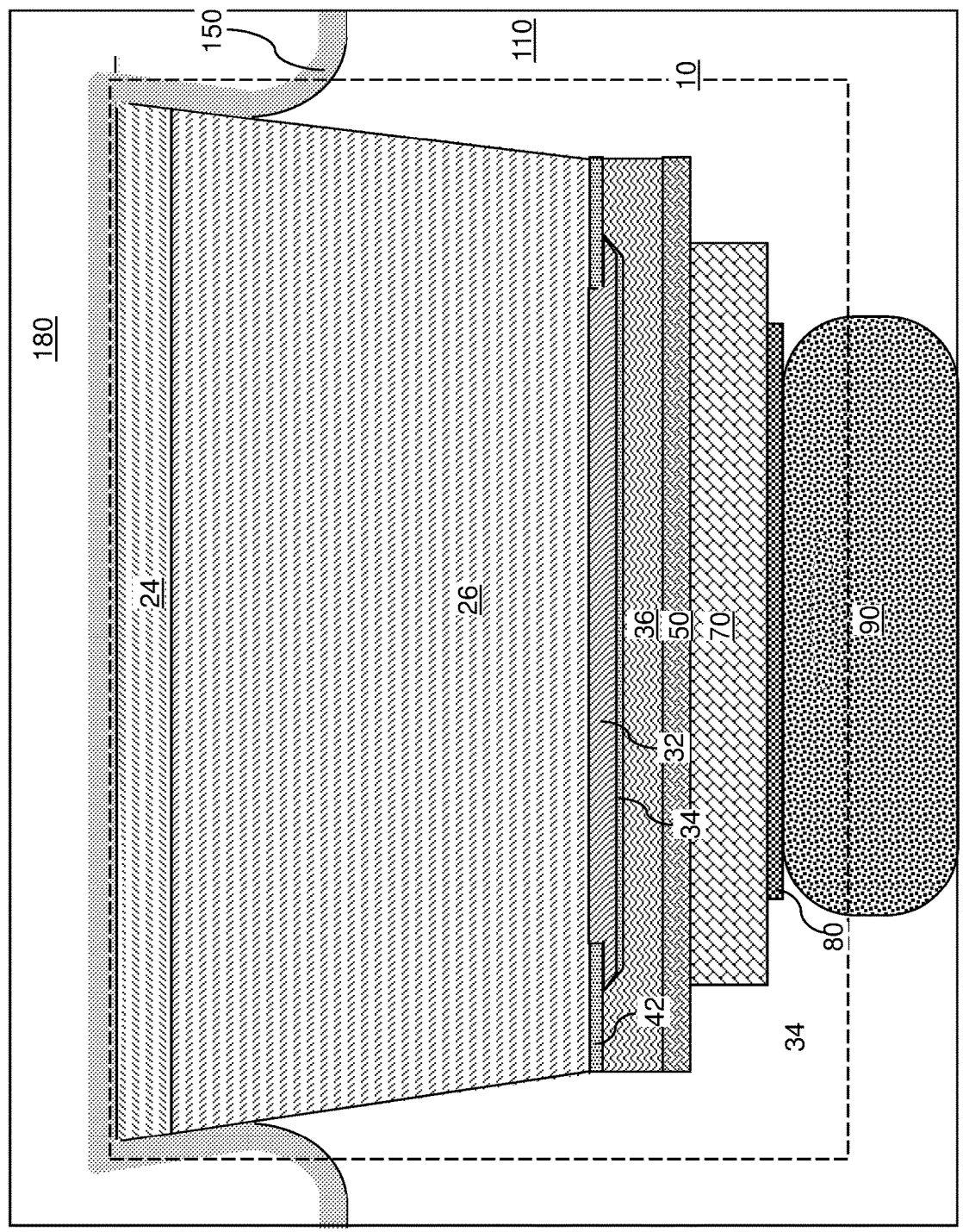
FIG. 10B is a magnified view of the region B in FIG. 10A.
Figure 10C:
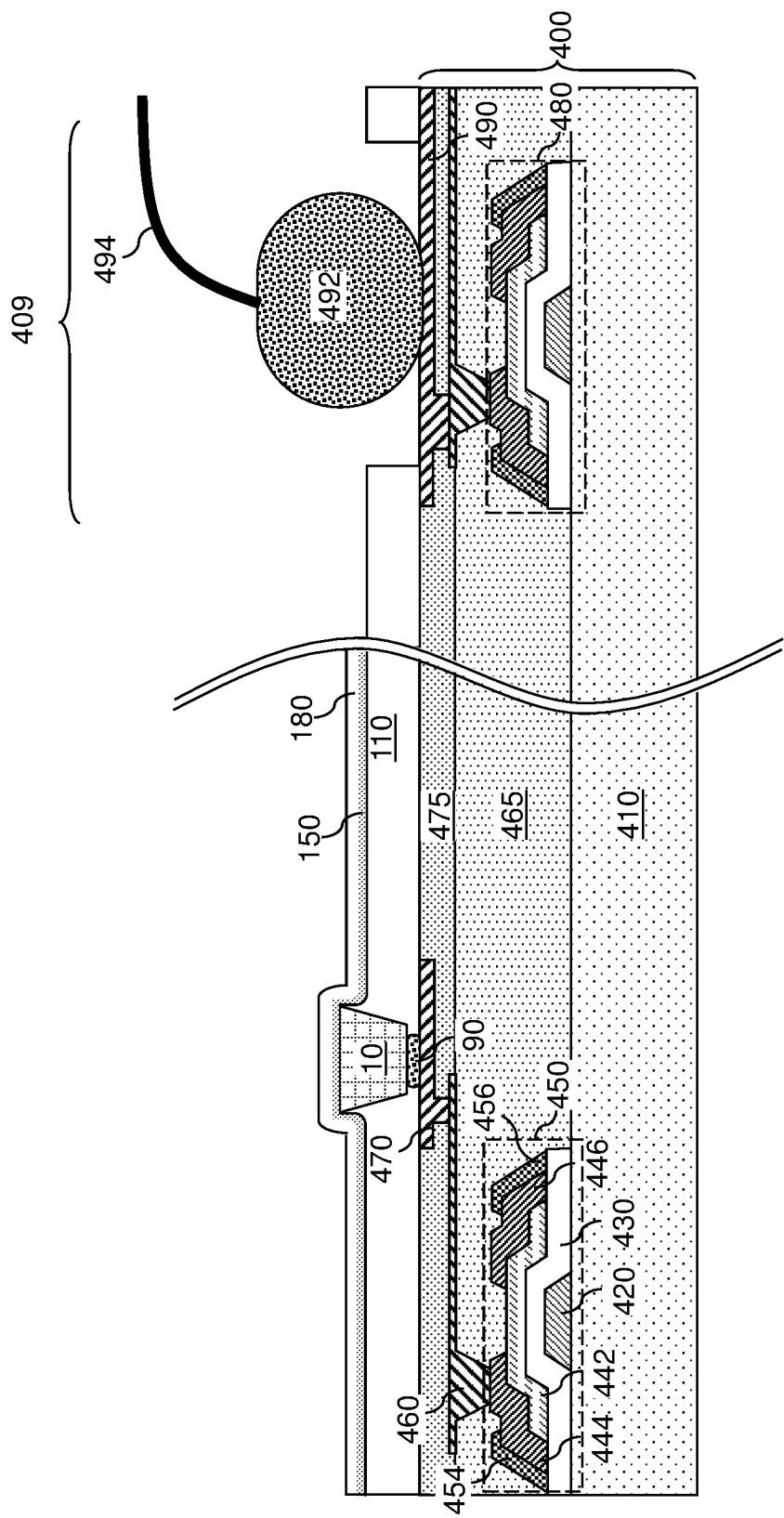
FIG. 10C is a vertical cross-sectional view of a peripheral region of the first exemplary structure at the processing step of FIG. 10A.

Referring to FIGS. 10A-10C, a conductive adhesion layer 150 can be formed directly on physically exposed surfaces of the light emitting diodes 10 and on the top surface of the positive tone, imageable dielectric material layer, such as the positive photoresist layer 110. The conductive adhesion layer 150 can be formed on upper portions of sidewalls (e.g., on the sidewalls of the n-doped compound semiconductor substrate layers 26) of the light emitting diodes 10, top surfaces of the light emitting diodes 10, and the top surface of the positive tone, imageable dielectric material layer, such as the positive photoresist layer 110. The conductive adhesion layer 150 can be formed by a conformal deposition process. Alternatively, a non-conformal deposition process may be employed to deposit the conductive adhesion layer 150 provided that such an anisotropic deposition process is capable of providing at least 10% of coverage for the reverse-tapered sidewalls of the light emitting diodes 10.

In one embodiment, the conductive adhesion layer 150 comprises, and/or consists essentially of, a metal or metal alloy, such as Ti, TiW, or a layer stack of a Ti layer and an Al layer. The conductive adhesion layer 150 may be deposited by spin coating, chemical vapor deposition, sputtering or electron beam evaporation. In one embodiment, the thickness of the conductive adhesion layer 150 can be selected so that the conductive adhesion layer 150 is optically transparent. In this embodiment, the conductive adhesion layer 150 may have a thickness in a range from 0.2 nm to 2 nm.

In one embodiment, the light emitting diodes 10 comprise a respective n-doped compound semiconductor substrate layer 26 having a horizontal cross-sectional area that strictly increases with a distance from the frontside of the backplane 400, and the conductive adhesion layer 150 is formed directly on sidewalls of the n-doped compound semiconductor substrate layer 26. In one embodiment, the light emitting diodes 10 comprise a respective single crystalline buffer semiconductor layer 24 that contacts an upper surface of the respective n-doped compound semiconductor substrate layer 26 and having a graded semiconductor composition, and the conductive adhesion layer 150 is formed directly on sidewalls of the single crystalline buffer semiconductor layers 24.

A transparent conductive layer 180 can be deposited directly on the frontside surface of the conductive adhesion layer 150. The transparent conductive layer 180 includes a transparent conductive oxide material such as a material selected from doped zinc oxide, indium tin oxide, cadmium tin oxide ($Cd_2SnO_4$), zinc stannate ($Zn_2SnO_4$), and doped titanium dioxide ($TiO_2$). Exemplary doped zinc oxide materials include boron-doped zinc oxide, fluorine doped zinc oxide, gallium doped zinc oxide, and aluminum doped zinc oxide. The thickness of the transparent conductive layer 180 can be in a range from 50 nm to 1 micron, such as from 100 nm to 600 nm, although lesser and greater thicknesses can also be employed.

Bonding structures (492, 494) can be formed on the peripheral connection pads 490. In this case, portions of the transparent conductive layer 180 and the conductive adhesion layer 150 in the peripheral region 409 can be removed. For example, a selective etch process that removes the materials of the conductive adhesion layer 150 in the peripheral region 409 selective to the material of the peripheral connection pads 490 can be performed while a temporary etch mask layer (such as a mid-ultraviolet (MUV) photoresist layer) covers the array region of the backplane 400. Alternatively, a lift-off process can be employed to lift off portions of the conductive adhesion layer 150 in the peripheral region 409 that are formed in the peripheral region 409. A solder ball 492 and a bonding wire 494 may be connected to each peripheral connection pad 490 in case the peripheral connection pads 490 are bonding pads. Alternatively, material portions overlying the peripheral connection pads 490 can be removed from the peripheral region 409 in case the peripheral connection pads 490 are contact pads that are configured to slide into a connection slot on a printed circuit board.

Figure 11:
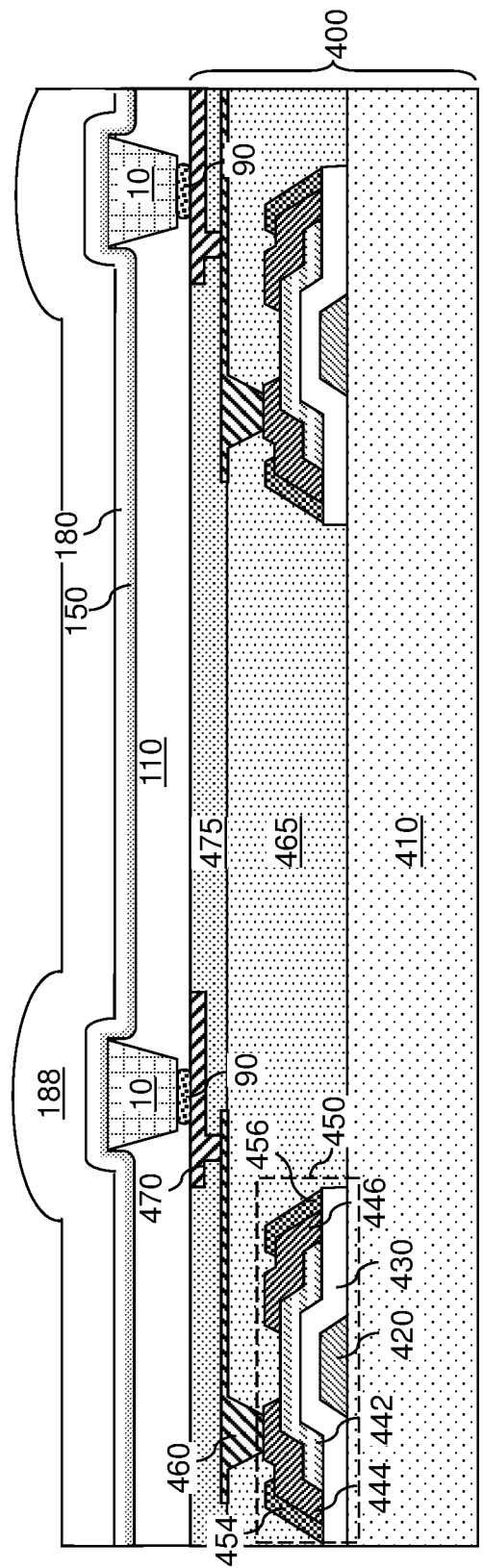
FIG. 11 is a vertical cross-sectional view of the array region of the first exemplary structure after formation of optional optical lenses according to the first embodiment of the present disclosure.

Referring to FIG. 11, optical lenses 188 may be optionally formed over the transparent conductive layer 180. For example, a flowable oxide layer or a transparent polymer layer (such as a clear polyimide material layer) may be applied over the transparent conductive layer 180. The flowable oxide layer or the transparent polymer layer may be partially cured to provide a suitable level of viscosity, and the patterned employing mechanical methods such as stamping or imprinting. An additional curing process may be performed to fully cure the flowable oxide layer or the transparent polymer layer.

Figure 12A:
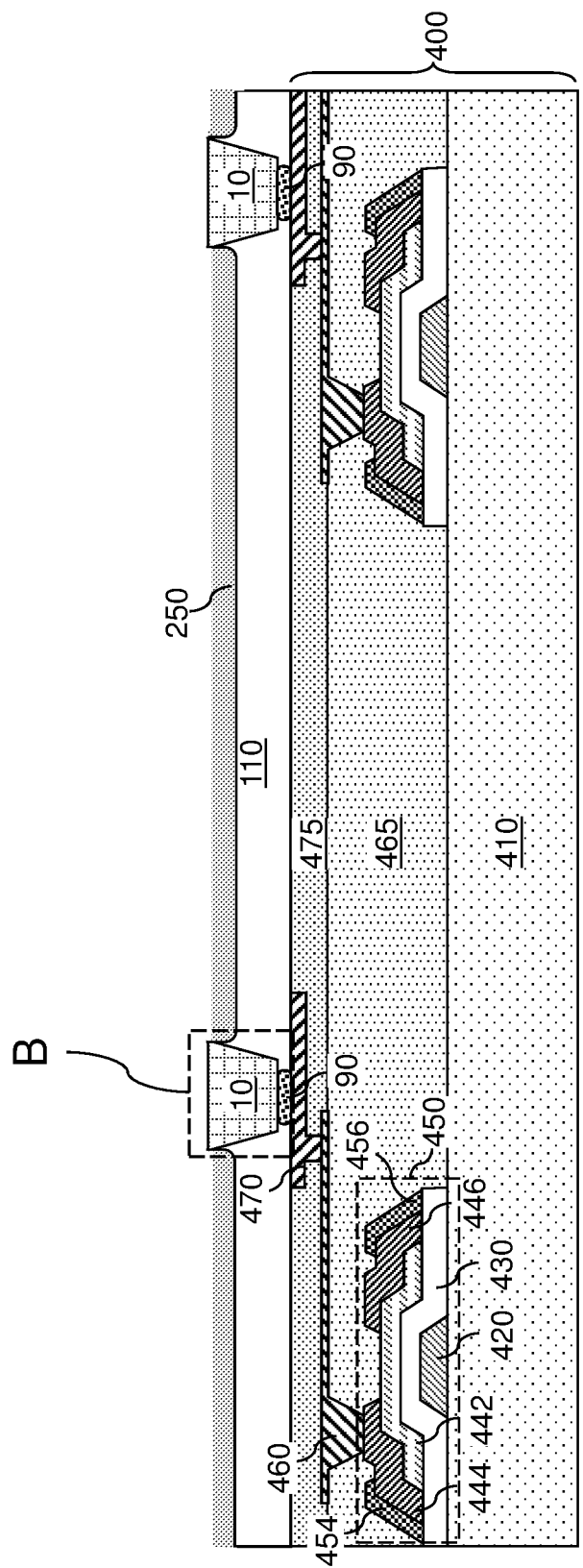
FIG. 12A is a vertical cross-sectional view of the array region of a second exemplary structure after formation of a conductive adhesion layer according to a second embodiment of the present disclosure.
Figure 12B:
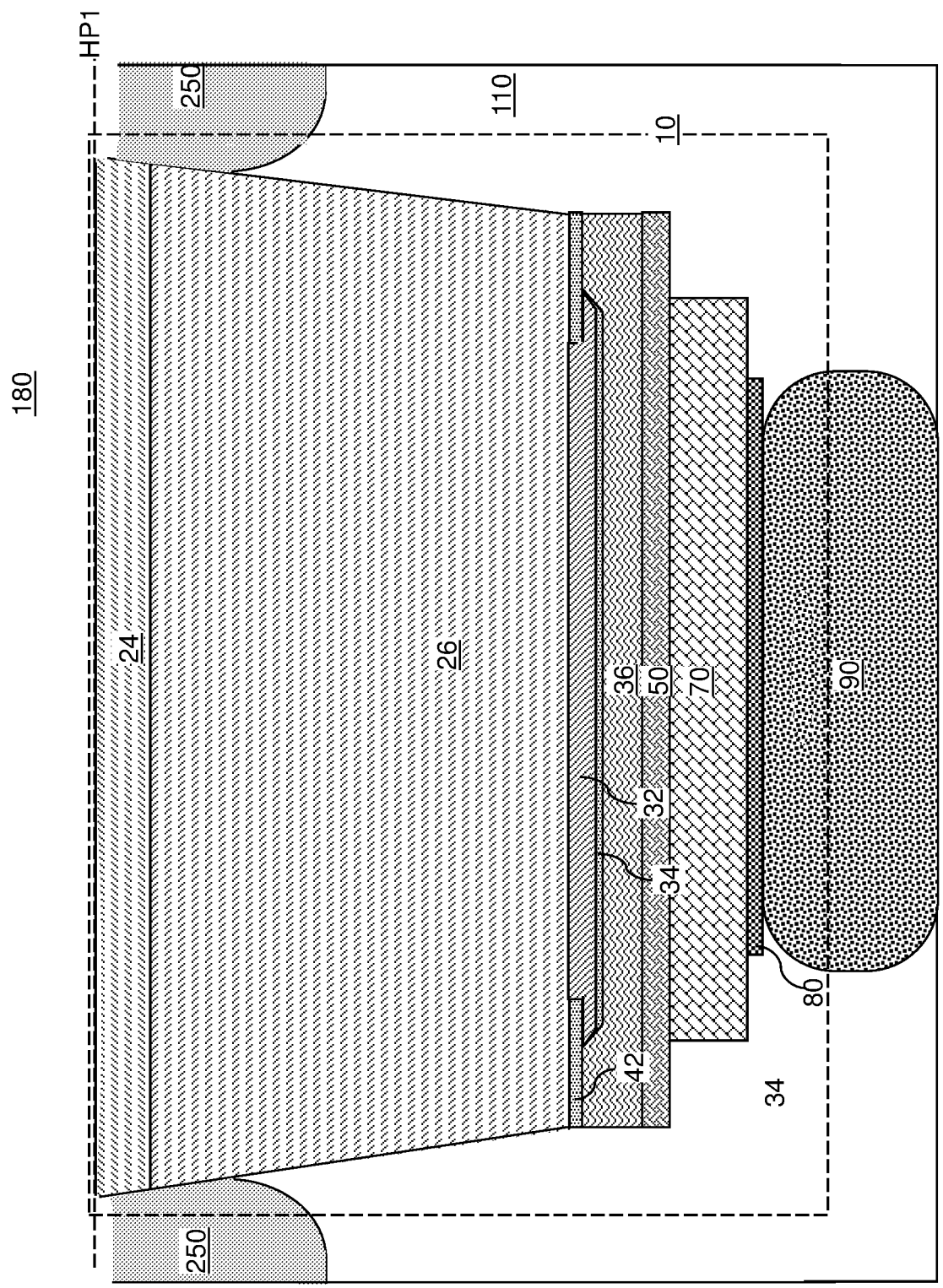
FIG. 12B is a magnified view of the region B in FIG. 12A.

Referring to FIGS. 12A and 12B, a second exemplary structure can be derived from the first exemplary structure of FIGS. 9A-9C by forming a conductive adhesion layer 250 employing a self-planarizing process that provides a planarized top surface. For example, the conductive adhesion layer 250 can be formed by applying a spin-on conductive material over the positive tone, imageable dielectric material layer, such as the positive photoresist layer 110 after vertically recessing the positive photoresist layer 110. The amount of dispensation for the spin-on conductive material can be controlled such that the spin-on conductive material forms a planar top surface below a horizontal plane including top surfaces of the light emitting diodes 10, i.e., below the first horizontal plane HP1. The depth of the top surface of the conductive adhesion layer 250 below the first horizontal plane HP1 may be in a range from 200 nm to 2 microns.

In one embodiment, the conductive adhesion layer 250 comprises, and/or consists essentially of, silver particles or nanowires, carbon nanotubes, or graphene sheets that are embedded within an organic matrix. The organic matrix can be cured to remove solvent employed to apply the spin-on conductive material. Because the top surface of the conductive adhesion layer 250 is located below the first horizontal plane HP1, the conductive adhesion layer 250 comprises an array of openings. Each light emitting diode 10 of the array of light emitting diodes 10 extends through a respective opening within the array of openings. In this case, the conductive adhesion layer 250 does not contact any top surface of the light emitting diodes 10, i.e., does not contact any top surface of the single crystalline buffer semiconductor layers 24 (if present in the final device).

Figure 13:
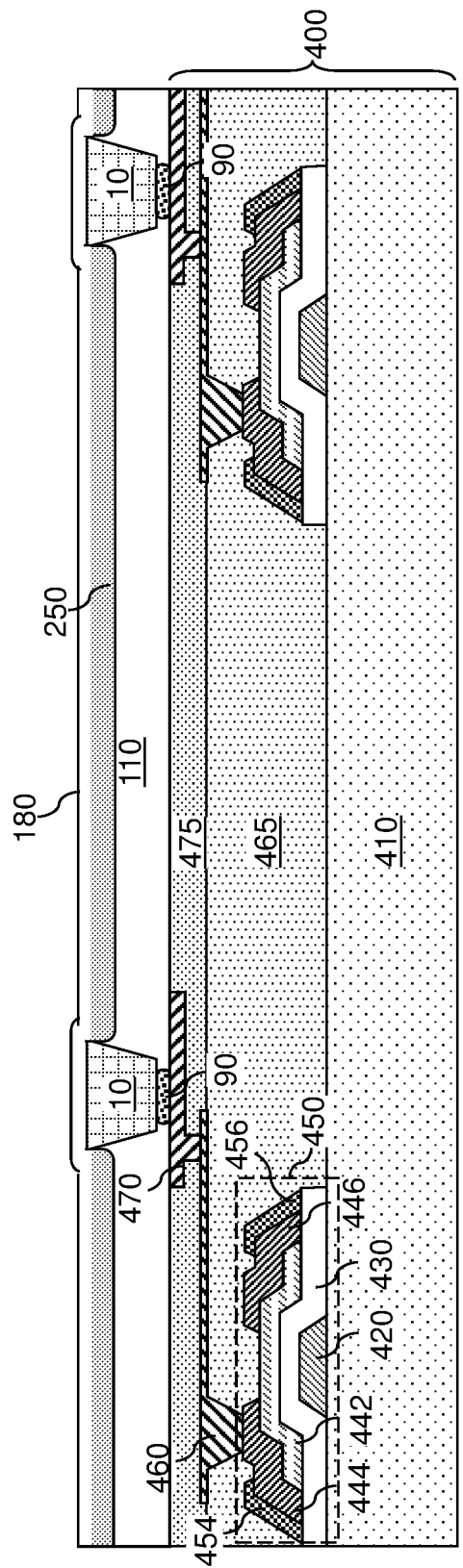
FIG. 13 is a vertical cross-sectional view of the array region of the second exemplary structure after formation of a transparent conductive layer according to the second embodiment of the present disclosure.

In one embodiment, the light emitting diodes 10 comprise a respective n-doped compound semiconductor substrate layer 26 having a horizontal cross-sectional area that strictly increases with a distance from the frontside of the backplane 400, and the conductive adhesion layer 250 is formed directly on sidewalls of the n-doped compound semiconductor substrate layer 26. In one embodiment, the light emitting diodes 10 comprise a respective single crystalline buffer semiconductor layer 24 that contacts an upper surface of the respective n-doped compound semiconductor substrate layer 26 and having a graded semiconductor composition, and the conductive adhesion layer 250 is formed directly on sidewalls of the single crystalline buffer semiconductor layers 24. In another embodiment, the top surface of the conductive adhesion layer 250 can be located below a horizontal plane including the interfaces between the n-doped compound semiconductor substrate layers 26 and the single crystalline buffer semiconductor layers 24, and the conductive adhesion layer 250 may not contact sidewalls of the single crystalline buffer semiconductor layers 24. The thickness of the conductive adhesion layer 250 may be in a range from 1 micron to 5 microns, such as from 1 micron to 3 microns, although lesser and greater thicknesses can also be employed. Referring to FIG. 13, a transparent conductive layer 180 can be deposited on the conductive adhesion layer 250 in the same manner as in the first embodiment.

Figure 14A:
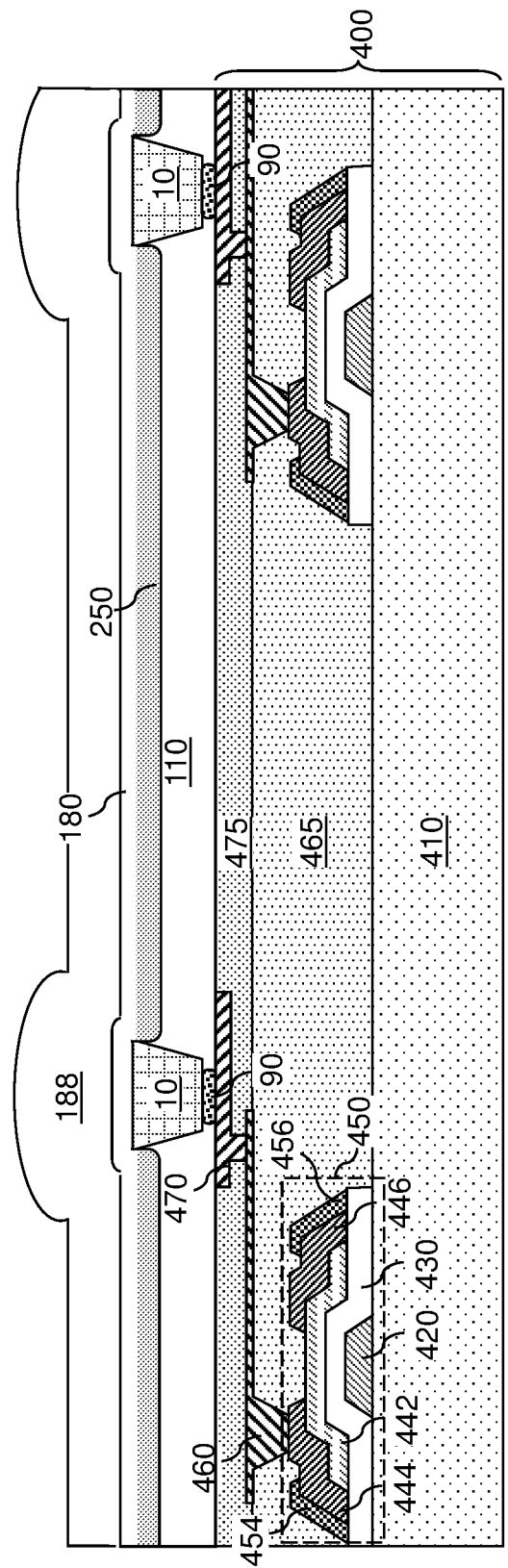
FIG. 14A is a vertical cross-sectional view of the array region of the second exemplary structure after formation of optional optical lenses and bonding structures according to the second embodiment of the present disclosure.
Figure 14B:
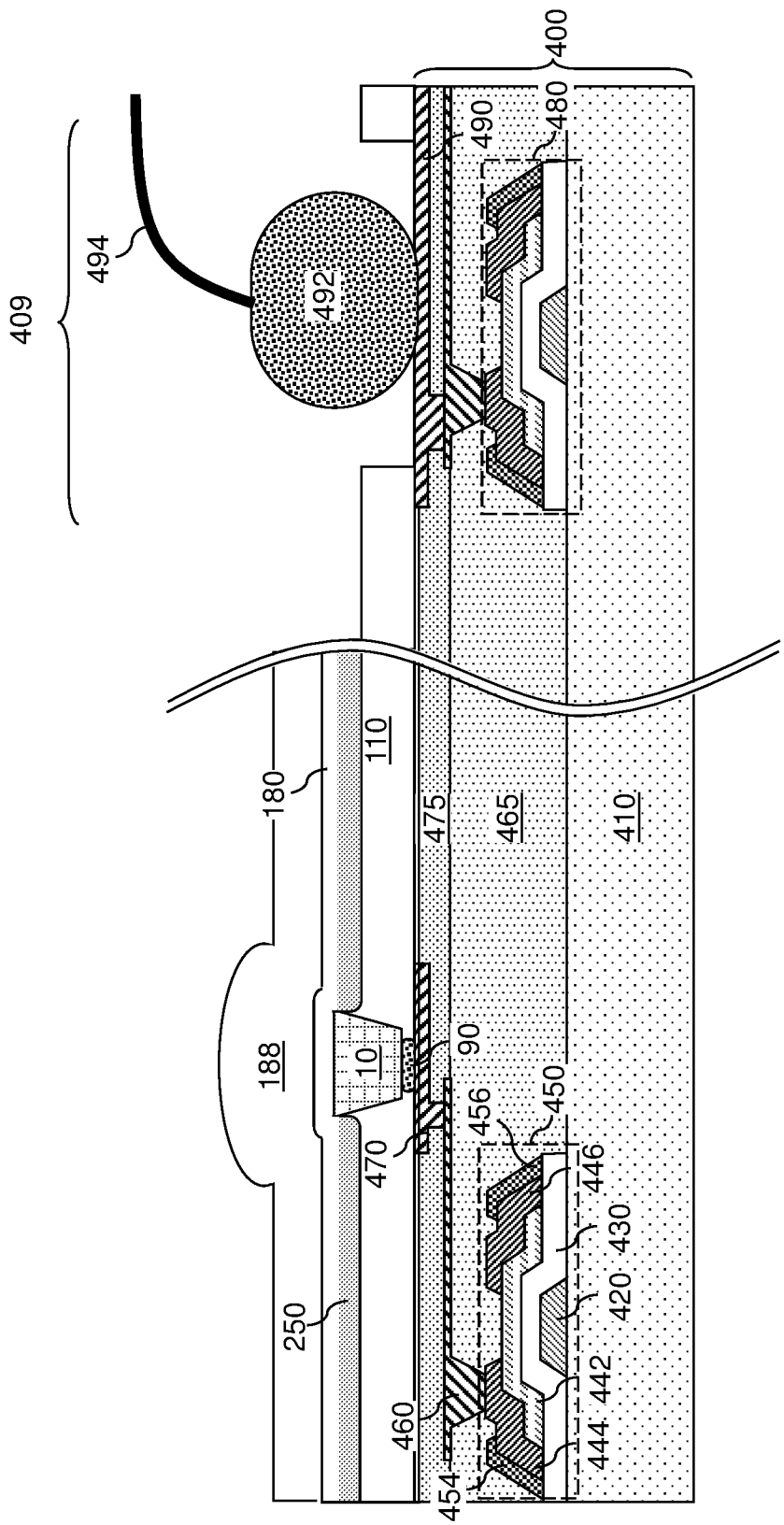
FIG. 14B is a vertical cross-sectional view of a peripheral region of the second exemplary structure at the processing step of FIG. 14A.

Referring to FIGS. 14A and 14B, bonding structures (492, 494) and optical lenses 188 may be formed in the same manner as in the first embodiment.

Referring to all drawings and according to various embodiments of the present disclosure, a light emitting device is provided, which comprises: a backplane 400; an array of light emitting diodes 10 attached to a frontside of the backplane 400; a positive tone, imageable dielectric material layer, such as the positive photoresist layer 110 located on the frontside of the backplane 400 and laterally surrounding the array of light emitting diodes 10, wherein sidewalls of the light emitting diodes 10 contacting the positive tone, imageable dielectric material layer, such as the positive photoresist layer 110 have a respective reentrant vertical cross-sectional profile; and at least one common conductive layer located over the positive tone, imageable dielectric material layer, such as the positive photoresist layer 110 and contacting the light emitting diodes.

In one embodiment, the at least one common conductive layer comprises a conductive adhesion layer (150 or 250) contacting upper portions of sidewalls of the light emitting diodes 10 and a top surface of the positive photoresist layer 110; and a transparent conductive layer 180 contacting a frontside surface of the conductive adhesion layer (150 or 250)

In one embodiment, each region that overlies top surfaces of the light emitting devices 10 excludes light absorbing material. In this case, the light emitted from the light emitting diode may be transmitted upward, i.e., away from the backplane 400.

The positive photoresist layer 110 provides a seamless interface with the light emitting diodes 10, thereby preventing ingress of moisture or contaminants along the sidewalls of the light emitting diodes 10 toward the backplane 400. The conductive adhesion layer (150 or 250) provides electrical contact without introducing any opaque structure over the top surfaces of the light emitting diodes 10, thereby enabling high efficiency light emission away from the backplane 400.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

What is claimed is:

1. A method of forming a light emitting device, comprising:
   attaching an array of light emitting diodes to a frontside of a backplane;
   applying a positive tone, imageable dielectric material layer to a frontside of the backplane;
   vertically recessing the positive tone, imageable dielectric material layer such that a top surface of the positive tone, imageable dielectric material layer is formed below a horizontal plane including top surfaces of the light emitting diodes, wherein sidewalls of the light emitting diodes contacting the positive tone, imageable dielectric material layer have a respective reentrant vertical cross-sectional profile; and
   forming a transparent conductive layer over the positive tone, imageable dielectric material layer.

2. The method of claim 1, wherein:
   the positive tone, imageable dielectric material layer comprises a positive photoresist layer; and
   sidewalls of the light emitting diodes are reverse-tapered to provide a variable horizontal cross-sectional area that increases with a vertical distance from a frontside surface of the backplane upon attaching the array of light emitting diodes to the frontside of the backplane.

3. The method of claim 2, wherein vertically recessing the positive photoresist layer comprises performing a blanket exposure process that uncross-links a cross-linked polymer in an upper portion of the positive photoresist layer and subsequently performing a development process.

4. The method of claim 2, wherein vertically recessing the positive photoresist layer comprises performing a blanket partial ashing process that removes an upper portion of the positive photoresist layer without removing a lower portion of the positive photoresist layer.

5. The method of claim 2, wherein:
   each of the light emitting diodes comprise a respective active region configured to emit light upon application of a bias voltage thereacross;
   a matrix portion of the positive photoresist layer adjoining the tapered encirclement portions and continuously extending around each of the light emitting diodes; and
   the top surface of the positive photoresist layer is formed between a first horizontal plane including top surfaces of the light emitting diodes and a second horizontal plane including the active regions of the light emitting diodes after vertically recessing the positive photoresist layer.

6. The method of claim 1, wherein the light emitting diodes comprise a respective n-doped compound semiconductor substrate layer having a horizontal cross-sectional area that strictly increases with a distance from the frontside of the backplane.

* * * * *